US 7,101,252 B2

United States Patent
Kitajima et al.

(10) Patent No.: US 7,101,252 B2
(45) Date of Patent: Sep. 5, 2006

(54) POLISHING METHOD AND APPARATUS

(75) Inventors: Tomohiko Kitajima, Chiba (JP); Gen Yasuhara, Chiba-ken (JP)

(73) Assignee: Applied Materials, Santa Clara, CA (US)

( * ) Notice: Subject to any disclaimer, the term of this patent is extended or adjusted under 35 U.S.C. 154(b) by 0 days.

(21) Appl. No.: 10/424,152

(22) Filed: Apr. 25, 2003

(65) Prior Publication Data
US 2004/0005845 A1 Jan. 8, 2004

(30) Foreign Application Priority Data
Apr. 26, 2002 (JP) ........................... 2002-127100

(51) Int. Cl.
B24B 49/00 (2006.01)
B24B 1/00 (2006.01)

(52) U.S. Cl. .................. 451/5; 451/8; 451/451; 451/41; 451/60; 451/63

(58) Field of Classification Search .................. 451/5, 451/8, 10, 11, 41, 56, 57, 60, 63, 285–289
See application file for complete search history.

(56) References Cited

U.S. PATENT DOCUMENTS

| | | |
|---|---|---|
| 3,702,043 A | 11/1972 | Welbourn et al. |
| 4,442,494 A | 4/1984 | Fromson et al. |
| 4,793,895 A | 12/1988 | Kaanta et al. |
| 5,036,015 A | 7/1991 | Sandhu et al. |
| 5,069,002 A | 12/1991 | Sandhu et al. |
| 5,081,051 A | 1/1992 | Mattingly et al. |
| 5,081,421 A | 1/1992 | Miller et al. |
| 5,081,796 A | 1/1992 | Schultz |
| 5,213,655 A | 5/1993 | Leach et al. |
| 5,222,329 A | 6/1993 | Yu |
| 5,240,552 A | 8/1993 | Yu et al. |
| 5,242,524 A | 9/1993 | Leach et al. |
| 5,244,527 A | 9/1993 | Aoyagi |
| RE34,425 E | 11/1993 | Schultz |
| 5,308,438 A | 5/1994 | Cote et al. |
| 5,321,304 A | 6/1994 | Rostoker |
| 5,337,015 A | 8/1994 | Lustig et al. |
| 5,413,941 A | 5/1995 | Koos et al. |
| 5,433,651 A | 7/1995 | Lustig et al. |
| 5,439,551 A | 8/1995 | Meikle et al. |

(Continued)

FOREIGN PATENT DOCUMENTS

| | | |
|---|---|---|
| JP | 7-221054 | 8/1995 |
| JP | 10-265209 | 9/1998 |
| JP | 11-251272 | 9/1999 |
| JP | 11-254311 | 9/1999 |
| JP | 2000-156360 | 6/2000 |
| JP | 2000-301454 | 10/2000 |
| JP | 2001-257187 | 9/2001 |
| JP | 2002-075938 | 3/2002 |
| JP | 2002-009031 | 9/2002 |

*Primary Examiner*—M. Rachuba
(74) *Attorney, Agent, or Firm*—Fish & Richardson

(57) ABSTRACT

A chemical mechanical polishing method for polishing an oxide film and a protective film formed on a substrate having recesses comprises four steps. The first step planarizes the oxide film using a polishing pad and a polishing agent containing cerium oxide particles by causing relative rotational motion between the substrate and the polishing pad. The second step continues polishing the oxide film to maintain the planarized property of the oxide film. The third step polishes the oxide film until at least a portion of the protective film becomes exposed. The fourth step polishes the oxide film until the oxide film is substantially removed and the protective film is substantially exposed. During the four steps, torque values are measured on the substrate or the polishing pad, and changes in torque with time are calculated. This information is used to determine the status of each of the steps during the polishing run.

17 Claims, 12 Drawing Sheets

U.S. PATENT DOCUMENTS

| | | |
|---|---|---|
| 5,456,627 A | 10/1995 | Jackson et al. |
| 5,486,129 A | 1/1996 | Sandhu et al. |
| 5,595,526 A | 1/1997 | Yau et al. |
| 5,597,341 A | 1/1997 | Kodera et al. |
| 5,618,447 A | 4/1997 | Sandhu |
| 5,637,031 A | 6/1997 | Chen |
| 5,639,388 A * | 6/1997 | Kimura et al. ................. 216/84 |
| 5,643,050 A | 7/1997 | Chen |
| 5,647,952 A | 7/1997 | Chen |
| 5,667,629 A | 9/1997 | Pan et al. |
| 5,700,180 A | 12/1997 | Sandhu et al. |
| 5,733,176 A | 3/1998 | Robinson et al. |
| 5,743,784 A | 4/1998 | Birang et al. |
| 5,830,041 A | 11/1998 | Takahashi et al. |
| 5,846,882 A | 12/1998 | Birang |
| 5,851,135 A | 12/1998 | Sandhu et al. |
| 5,860,847 A * | 1/1999 | Sakurai et al. ................. 451/10 |
| 5,914,275 A | 6/1999 | Kodera et al. |
| 5,948,205 A | 9/1999 | Kodera et al. |
| 6,046,111 A | 4/2000 | Robinson |
| 6,093,080 A * | 7/2000 | Inaba et al. ..................... 451/5 |
| 6,120,347 A | 9/2000 | Sandhu et al. |
| 6,191,037 B1 | 2/2001 | Robinson et al. |
| 6,206,754 B1 | 3/2001 | Moore |
| 6,213,846 B1 * | 4/2001 | Li et al. ......................... 451/6 |
| 6,224,464 B1 * | 5/2001 | Nojo et al. ..................... 451/41 |
| 6,238,590 B1 | 5/2001 | Fischer et al. |
| 6,257,953 B1 | 7/2001 | Gitis et al. |
| 6,283,829 B1 | 9/2001 | Molnar |
| 6,293,845 B1 * | 9/2001 | Clark-Phelps ................. 451/5 |
| 6,340,434 B1 | 1/2002 | Mizuno et al. |
| 6,383,058 B1 | 5/2002 | Birang et al. |
| 6,435,942 B1 | 8/2002 | Jin et al. |
| 6,623,334 B1 | 9/2003 | Birang et al. |

* cited by examiner

POLISHING METHOD AND APPARATUS

CLAIM FOR PRIORITY UNDER 35 U.S.C. §119

A claim for priority is made under the provisions of 35 U.S.C. §119 for the present U.S. patent application based upon Japanese Patent Application Serial No. JP2002-127100, filed on Apr. 26, 2002.

BACKGROUND

1. Field of the Invention

The present invention relates to chemical mechanical polishing (CMP), and in particular to methods and apparatus for removing an oxide film from a protective film formed over a substrate having depressions or recesses by chemical mechanical polishing.

2. Background Information

In recent years, in the manufacture of semiconductor devices, mounting density has been increasing and element construction has been rapidly becoming finer. Design rules are already shifting to the order of sub-half micrometers (i.e., submicrons). To realize such fine dimensions, CMP techniques in the planar process are employed for the surface of the substrate material. This improves the flatness (planar property) of the pattern exposure surface in the manufacture of semiconductor devices. As a result, it is possible to improve yield and device reliability. CMP has therefore become an indispensable technique in the planar process of interlayer insulation films formed on the substrate material surface, and in other processes such as separating elements.

For separation of elements that are larger than 0.5 micrometers, a technique known as Local Oxidation of Silicon (LOCOS) has been used. For elements that are finer than 0.5 micrometers, Shallow Trench Isolation (STI) methods are used to cope with the decrease in the element separation width. To use STI, CMP is first employed to remove excess oxide film, such as silicon dioxide laid on a substrate. As a preparatory layer for an oxide film, a protective film of silicon nitride ($Si_xN_y$) is typically formed as a stop layer for the polishing.

While silica-based slurries have been widely used as a polishing agent in CMP processes, cerium-based slurries containing cerium particles are increasingly being used in the manufacture of semiconductor devices with submicron elements. This is due to the high selectivity between the oxide film and the protective film (high polishing speed ratio) as well as other factors such as improved polishing speed, lower pattern dependence of the polished surface, reduction in metallic impurities, etc.

In a CMP process, the excess portion of the oxide film must be removed appropriately, and therefore control over the polished amount is important. The detection of a stop or end point of the polishing is also important. To accurately detect the polishing end point, various methods are used. Japanese Patent Publication No. 3177549, Patent Publication No. 6-31850, and Patent Publication No. 10-202522 describe methods or devices for detecting the end point of a CMP process by indirectly measuring the polishing amount from the torque of the substrate holder during polishing, its differential value, and the change in its integral values. A more accurate method for detecting the end point is also disclosed using a laser beam to measure the thickness of the surface being polished and determine the polished amount. The latter method is generally deemed to be advantageous for situations where a higher accuracy is required for the end point detection, such as situations associated with finer processing dimensions.

Unfortunately, conventional optical methods for end-point detection in CMP processes using cerium-based slurries have shown some difficulty in reliably detecting the end point. The optical detection intensity is poor when compared to silica-based slurries used under the same optical measurement conditions, and satisfactory improvement was not recognized. It is believed that light scattering through the cerium-based slurry may cause these problems.

End point detection by the conventional torque methods has been attempted using cerium-based slurries. Both real-time torque values and differential/integral values of the change in torque have been used for end-point detection. In both cases, accurate detection of the end point was prone to be difficult. In many cases, the end point was either not detected or a plurality of end points were detected.

Accordingly, the use of CMP with cerium-based slurries, particularly when forming elements by STI, presents process management or control problems. Methods and devices as therefore needed that allow for adequate process management and process control when using these CMP techniques.

SUMMARY

In one implementation of the invention, a polishing method for chemical mechanical polishing of an oxide film adhered on a protective film formed on a substrate having recesses comprises four steps. The first step is planarizing the oxide film by bringing the oxide film into contact with a polishing pad, supplying a polishing agent containing cerium oxide particles between the oxide film and the polishing pad, and causing relative rotational motion between the substrate and the polishing pad. The second step is continuing to polish the oxide film once the oxide film has been planarized, thereby maintaining the planarized property of the oxide film. The third step is continuing to polish the oxide film until at least a portion of the protective film becomes exposed. And the fourth step is continuing to polish the oxide film until the oxide film is substantially removed and the protective film is substantially exposed. During the polishing run where all four steps are carried out, the method includes measuring torque values on the substrate or on the polishing pad either continuously or at intervals. Next, the method includes calculating changes in the torque over time to determine the status of each of the first through fourth steps concurrently with the polishing method.

In another implementation, a polishing device for chemically mechanically polishing an oxide film adhered on a protective film formed on a substrate having recesses includes a substrate holding section for holding the substrate, a polishing section having a polishing pad disposed opposite the substrate holding section, a driving mechanism for rotating the one or both of the substrate holding section and the polishing pad, a polishing agent supplier for supplying polishing agent between the substrate and the polishing pad, a water supplier for supplying water between the substrate and the polishing pad, a torque measuring device for measuring torque values on the driving mechanism either continuously or at intervals, and a process monitoring device for monitoring the real-time status of a polishing run by calculating changes in torque with time using the measured torque values.

In this implementation, the polishing run can include four steps. The first step is planarizing the oxide film by bringing the oxide film into contact with a polishing pad, supplying a polishing agent containing cerium oxide particles between the oxide film and the polishing pad, and causing relative rotational motion between the substrate and the polishing pad. The second step is continuing to polish the oxide film once the oxide film has been planarized, thereby maintaining the planarized property of the oxide film. The third step is continuing to polish the oxide film until at least a portion of the protective film becomes exposed. And the fourth step is continuing to polish the oxide film until the oxide film is substantially removed and the protective film is substantially exposed. During the polishing run, the polishing device can monitor the real-time status of the process by detecting transition points between adjacent steps of the first through fourth steps and detecting anomalies in at least one of the first through fourth steps.

DETAILED DESCRIPTION

In certain shallow trench isolation (STI) processes where an oxide film and a protective film on a silicon wafer are being polished, there are measurable torque changes that can indicate when that oxide film has been planarized, when the protective film has been partially exposed, and when the protective film has been substantially entirely exposed. For instance, this is typically the case for processes where trench widths are around 250 microns, and where cerium-based slurries are used.

There are two locations in the chemical mechanical polishing apparatus where torque measurements can be taken. The first location is a drive shaft that rotates a substrate holder upon which the silicon wafer substrate is mounted. This drive shaft rotates the silicon wafer substrate during the polishing process, and the torque at this location is referred to herein as the "torque about the substrate holder". The second location is the drive shaft that rotates the polishing pad during the polishing process. This torque is referred to herein as the "torque about the polishing pad".

In one implementation, the torque is monitored over time to detect changes in the torque. The torque can be monitored by measuring changes over time in the driving current, the driving voltage, or the driving power of the mechanism that rotates the substrate holder or the polishing pad. For example, if voltage is held constant, the change over time of the driving current can be measured. If the current is held constant, the change over time of the driving voltage can be measured. Otherwise, the driving power supplied to the drive shaft of the substrate holder or the drive shaft of the polishing pad can be monitored.

Figure 1:
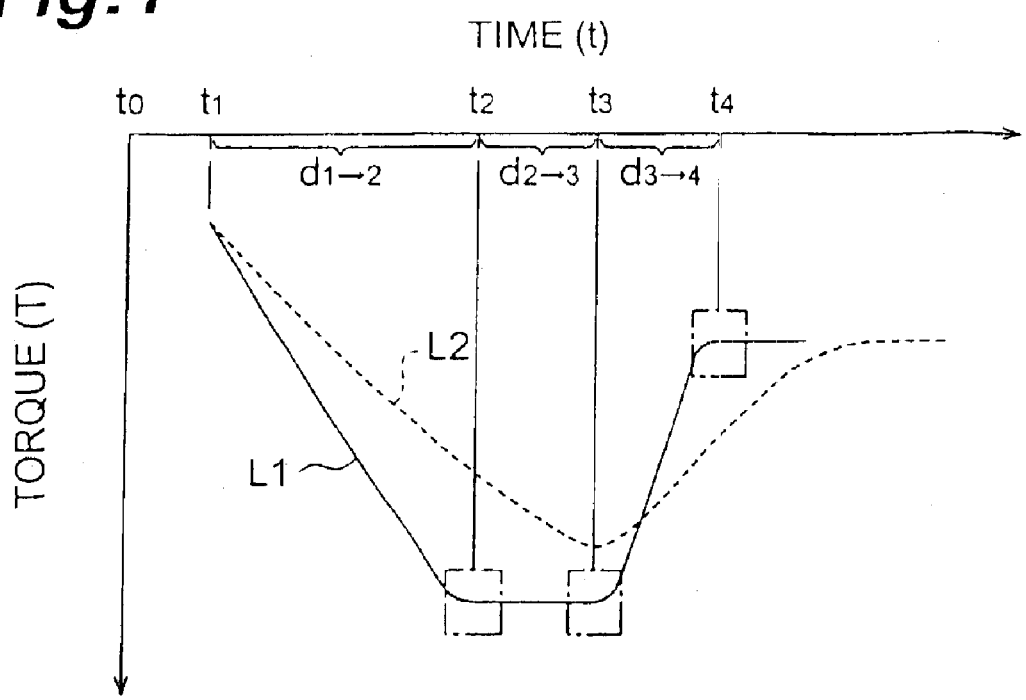
FIG. 1 is a graph plotting torque changes for a silicon wafer being polished with a cerium-based slurry.

FIG. 1 is a graph plotting torque changes for a polishing run where a silicon wafer is polished with a highly selective, cerium-based slurry. In FIG. 1, the torque was measured using the driving current to the drive shaft of the polishing pad. The silicon wafer used in FIG. 1 includes trenches (i.e., recesses) formed in a silicon layer that is covered by a silicon nitride protective film and a silicon oxide film, where the silicon oxide film has a stepped pattern. The cerium-based slurry can be one of many types of slurries that have a relatively high polishing speed with respect to the silicon oxide film, and have a very low polishing speed with respect to the silicon nitride film.

The solid line curve L1 plots the measured torque in FIG. 1. As shown, when the chemical mechanical polishing is carried out normally, the measured torque will change throughout the process. During the polishing run, the torque tends to gradually increase during the first step of the process as the stepped pattern of the oxide film is planarized, which is what occurs from time point $t_1$ to time point $t_2$. Once the oxide film is planarized, the measured torque remains fairly constant for a time while the planar oxide film continues to be polished, which occurs from time point $t_2$ to time point $t_3$. When the polishing process reaches the nitride film, the measured torque tends to rapidly decrease as the oxide layer is removed and the nitride film is exposed. This is the transition from the oxide film to the nitride film. Once the nitride film is completely exposed (i.e., the oxide film is completely removed), the measured torque tends to become fairly constant once again.

Figure 2:
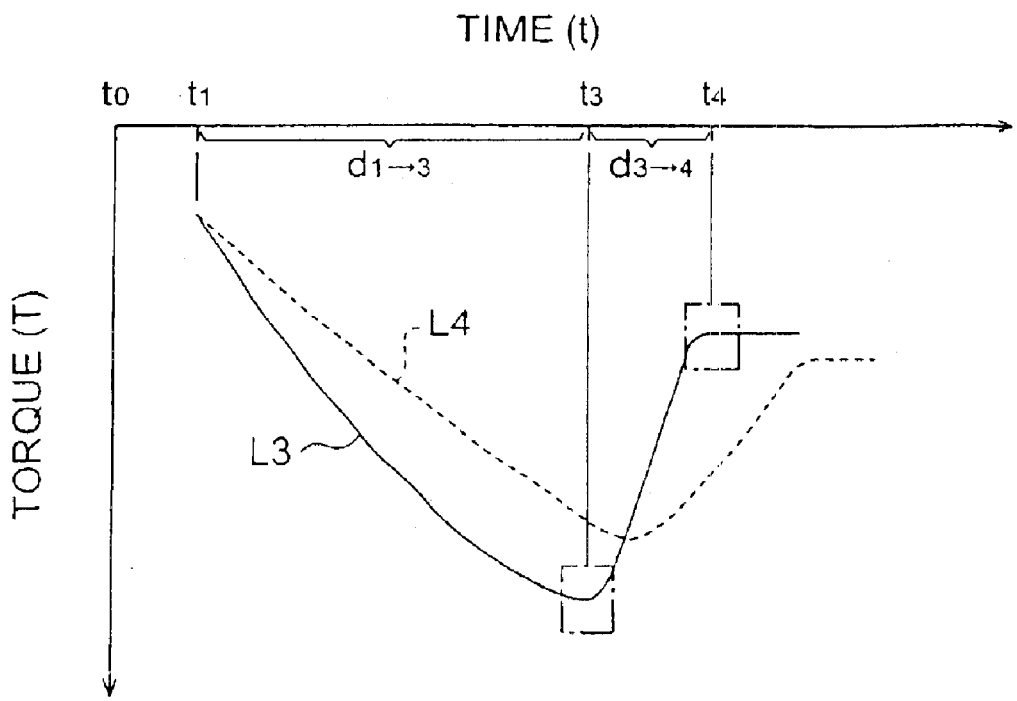
FIG. 2 is a graph plotting torque changes for a silicon wafer with a very thin oxide film being polished.

FIG. 2 is another graph plotting torque changes during a polishing run where a silicon wafer is polished. Here, the polishing is carried out using a silicon wafer with a very thin oxide film formed in excess on the trenches of the silicon layer. The solid line curve L3 plots the measured torque in FIG. 2. When a normal polishing process is carried out on such a wafer, as shown in FIG. 2, the torque tends to gradually increase over a period of time (i.e., from time point $t_1$ to time point $t_3$) as the first step of this polishing process accomplished two things—it planarizes the oxide film and it polishes some of the oxide film within the recesses of the silicon layer. Since both of these processes occur together, there is no clear torque change or plateau in the measured torque that indicates planarization of the oxide film. Any changes that occur to the measured torque are related to polishing of the silicon layer, and not planarization of the oxide layer.

Figure 3:
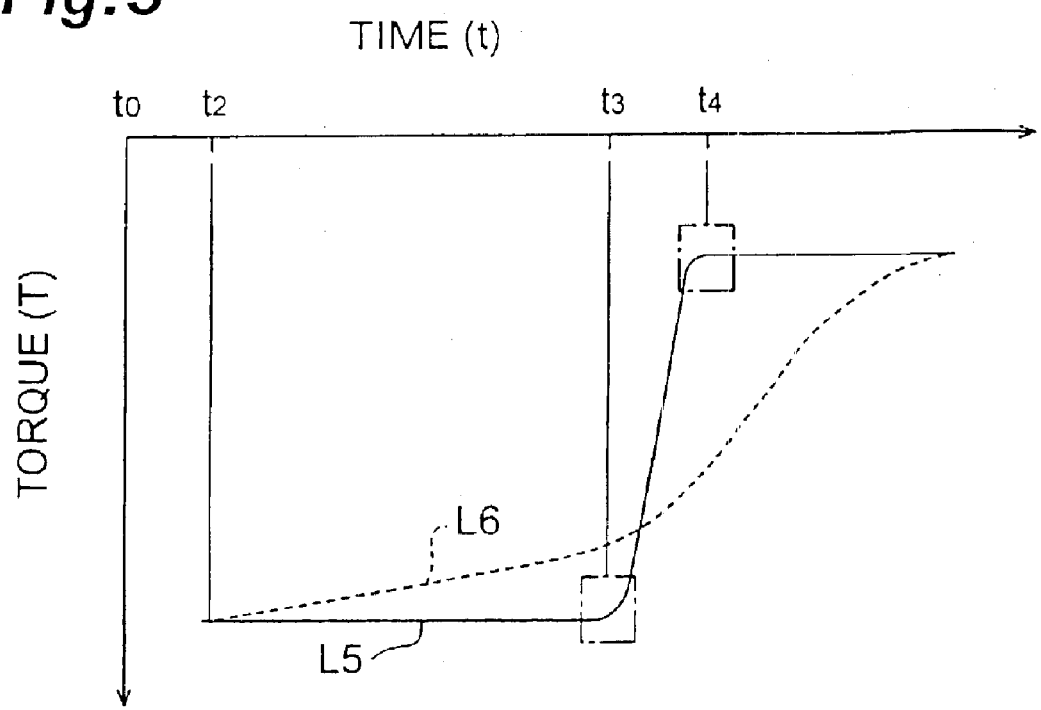
FIG. 3 is a graph plotting torque changes for a silicon wafer with an oxide film having no stepped pattern being polished.

FIG. 3 is another graph showing torque changes for the same polishing run as described above, but using a silicon wafer with an oxide film having no stepped pattern. The solid line curve L5 plots the measured torque in FIG. 3. When a conventional polishing process is carried out on this silicon wafer, the process starts out at the second step described above in reference to FIG. 1, as the oxide film is already substantially planarized. From that point forward, the curve L5 behaves similarly to the curve L1 of FIG. 1.

As described above, conventional methods for detecting the polishing end point using silica-based slurries cannot be applied sufficiently to the STI polishing process. In FIGS. 1 to 3, the end point of the oxide film polishing corresponds to the end point of the third step, which is around time point $t_4$ in the graphs.

Figure 4:
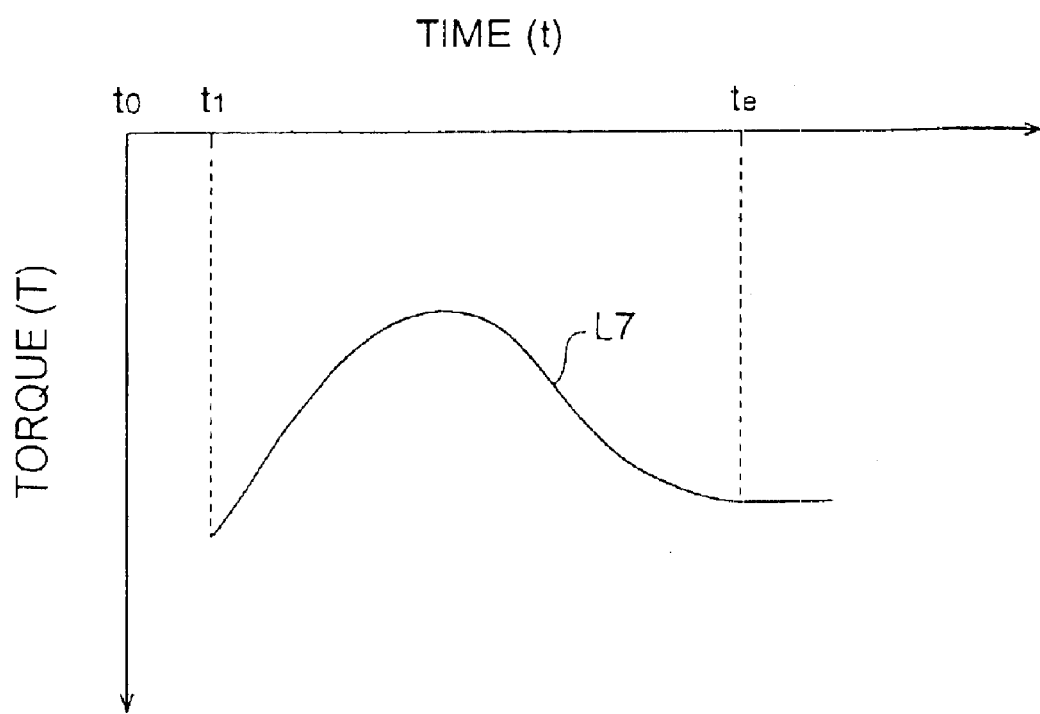
FIG. 4 is a graph plotting torque changes for a silicon wafer being polished with a silica-based slurry.

FIG. 4 is a graph plotting torque changes for a polishing run similar to the polishing run used in FIG. 1, with the exception that a silica-based slurry was used rather than a cerium-based slurry. The solid line curve L7 plots the measured torque in FIG. 4. As shown in the graph, the torque tends to decrease from the beginning of the polishing process (time point $t_1$), and then tends to increase until the polishing process ends at the time point $t_e$.

As shown above, the torque associated with the silica-based slurry tends to behave quite oppositely of the torque associated with the cerium-based slurry. Furthermore, other details of the graphs are also different, such as the presence of plateaus, when torque changes occur, how they occur, etc.

According to an implementation of the invention, the above described first to fourth steps are carried out in sequence using a cerium-based slurry. Again, those steps comprise a first step of planarizing the oxide film, a second step of polishing the oxide film, a third step of beginning to expose the nitride film, and a fourth step of completely exposing the nitride film. In this implementation, the monitoring process is started during the step of polishing the excess oxide film using the cerium-based slurry (the second step). The monitoring process consists of measuring the torque of the mechanism that rotates the substrate holder and/or the polishing pad. This provides a more accurate end point detection process. Incidentally, during the fourth step, the monitoring process can continue even if the primary polishing process is brought to an end and an alternate polishing process (e.g., buff-polishing, etc.) is carried out using pure water or the like in place of the cerium-based polishing agent.

As described above, if no pattern is formed in the oxide film, the polishing process can be carried out using the second to fourth steps while omitting the first step. Moreover, the same kind or composition of polishing agent can be used in the first through fourth steps as long as the polishing agent contains cerium oxide particles. Alternately, the polishing agent can be different from step to step. Furthermore, depending on the composition of the polishing agent used in the first step, or depending on the overly formed film thickness, it is possible that the second step will either not be present or will not be recognized despite its presence. In that case, the first step is followed by the third step.

It is also possible to determine a transition point between any two adjacent steps of the first to fourth steps described above on the basis of measured changes in torque values over time during the monitoring process. By recognizing transition points between the first and second steps, between the second and third steps, or between the third and fourth steps, it is possible to monitor the progress of the polishing process for forming elements by STI using cerium-based slurries. In other words, it is not only possible to detect the end points but also to appropriately stop each step and/or switch conditions of each step when it is preferable to apply different polishing conditions to respective steps.

In one implementation of the monitoring process, the system can assume the transition point to be a time point at which the increase in torque in the first step slows down or the torque becomes nearly constant, or the rate of torque change with time in the first step changes from a positive value to an approximate zero at which the planarization process is finished, and the system can then assume the end of the first step to have been detected.

The above-described method is effective when a predetermined pattern is formed and present in the oxide film. In the case of a smooth oxide film without any pattern, however, since the first step may be omitted as described above, in some cases the detection of the end of the first step becomes unnecessary. Also as described above, depending on the composition of the polishing agent used in the first step, the second step may be substantially nonexistent. In that case, the detection of the end of the first step is immediately followed by the third step.

When the first step and the transition from the first to the second step are carried out as shown in FIG. 1, along with the polishing away of the stepped shape, the torque increases at an even rate as the resistance increases due to the contact surface area between the polishing pad and the polished surface increasing from the time point $t_1$ to $t_2$. The rate of change in torque is a positive value during this time period. The resistance approaches a ceiling in the vicinity of the time point $t_2$, and the increase in the torque slows down to approach a constant value.

In an implementation of the monitoring process, the system can assume the transition point to be a time point at which the torque in the second step changes from being nearly constant to being a decreasing value, or the rate of torque change with time in the second step changes from being zero to being a negative value at which partial exposure of the protective film occurs, and the system can then assume the end of the second step to have been detected.

As described above, depending on the composition of the polishing agent used in the first step, the second step may be substantially nonexistent. In that case, the detection of the end of the second step is unnecessary. When the second step (or the first step if the second step is omitted) and the transition from the second to third step are performed as shown in FIGS. 1 to 3, the polishing of the planar-processed oxide film is almost completed over the time period from $t_2$ to $t_3$, and the protective film of nitride or the like begins to be exposed. During this time, polishing resistance decreases because of low reaction-and-polishing effect of the polishing agent on the nitride film. Accordingly, the torque value begins to decrease and its rate of change becomes negative.

In another implementation, the system can detect the end of the third step by assuming the transition point to be a time point at which the decreasing torque value begins to stabilize or become nearly constant, or at which the rate of change in torque with time transitions from a negative value to a value of approximately zero. This is generally the time point at which the oxide film on the protective film is removed and the protective film is exposed nearly entirely.

As shown in FIGS. 1 to 3, when the third step and the transition from the third to fourth step are carried out normally, any oxide film remaining on the nitride film is gradually removed over the time period $t_3$ to $t_4$. As the oxide film is almost entirely removed, the decreasing torque value stabilizes and approaches a constant value.

Detecting the transition point from step to step as described above is equivalent to real time monitoring of deviations from a pattern of change in torque over time for a normal polishing process. Therefore, in one implementation of the invention, the monitoring process can be used to detect anomalies in one or more of the first to fourth steps. This is done by comparing the change in torque over time for a real-time process to a predetermined reference pattern of the change in torque over time for a normal polishing process. Factors that go into generating predetermined patterns of torque changes include the type or constitution of the oxide film and/or protective film, and the type of polishing agent used.

It is also useful to detect the occurrence of an anomaly in one of two adjacent steps when no transition point is detected between the two steps. The lack of a transition point can be based on either a direct comparison of the measured values to a predetermined pattern, or on the measured values themselves.

As described above, if the polishing process and transitions from one step to another are carried out normally and smoothly, the transition points should be detectable. If an expected transition point is not detected, it is possible that an anomaly occurred in at least one of the prior or subsequent steps.

In an implementation of the invention, an anomaly in the first step is detected during the monitoring process when the difference between the rate of torque change in the first step (or the time required for the first step) according to the reference pattern and the rate of torque change (or time required for the first step) according to the measured values exceeds a predetermined allowable value.

The above method is particularly effective when a specified pattern is formed in the oxide film. When the oxide film has no pattern and is smooth, however, since the first step is omitted as described before, anomaly detection for the first step is unnecessary. From the standpoint of quick detection of anomalies, the determination by the torque increase rate is preferable to that by the required time for the first step.

If the rate of torque change between time points $t_1$ and $t_2$ is smaller than the rate provided in the reference pattern, namely if the increase in the rate of torque is small, or if the time required to complete the process step is long, an anomaly is suspected in the process. The anomaly can be many things including an abnormal reduction in the polishing speed due to wear of the polishing pad, or an incomplete step disappearance due to the presence of foreign matter. If an anomaly is suspected, the first step of the process can be stopped for remedial measures including but not limited to inspection, maintenance, replacing parts, and cleaning of the system.

It is also preferable to arrange the monitoring process in such a way that an incidence of anomaly in the second step is assumed to have been detected in the monitoring process when the difference between the rate of torque change with time in the second step (or time required for the second step) according to the reference pattern and the rate of torque change with time (or time required for the second step) according to the measured values respectively exceeds a predetermined allowable value, or when no substantial presence of the second step is recognized from the measured values.

As described above, as long as the second step is carried out normally, the rate of change in torque is usually nearly zero or the torque is nearly constant. In other words, if the torque is not constant, or if the difference between the measured torque and the reference torque exceeds the allowable value, an anomaly is suspected, such as reduction in the polishing speed due to worn polishing pad, or irregular flatness and surface non-uniformity due to the presence of foreign matter, which can be detected. This is also true when the required time to complete a process step is abnormally long.

Nonexistence of the second step is recognized when the time required to complete the second step is extremely short or nearly zero, namely when no plateau matching the reference pattern is recognized from the measured values of the change in torque with time (i.e., when the increase in torque in the first step shifts abruptly to a decrease in torque). In that case, the second step of the process may be stopped for remedial measures such as inspection, maintenance, replacing parts, or cleaning. As described above, when the second step is not substantially present, it is unnecessary to determine an incidence of a process anomaly even if no presence of the second step is recognized.

It is also preferable to arrange the monitoring process in such a way that an incidence of anomaly in the third step is assumed to have been detected in the monitoring process when the difference between the rate of torque change in the third step (or the time required for the third step) according to the reference pattern and the rate of torque change (or the time required for the third step) according to the measured values exceeds a predetermined allowable value, or when no substantial presence of the third step is recognized from the measured values. From the standpoint of quick detection of the anomaly, the determination by the torque decrease rate tends to provide better results than using the required time for the third step.

If the torque change is small in comparison with that of the reference pattern, namely if the decreasing rate of torque is small, or if the required time is abnormally long, an anomaly is suspected such as abnormal reduction in the polishing speed due to wear of the polishing pad, unsatisfactory transition from the oxide film to the protective film, or irregular flatness or planar unevenness due to the presence of foreign matter. Again, such anomalies can be detected using the methods of the invention. In the case of an anomaly, the third step of the process can be halted and remedial measures can be taken.

In yet another implementation, the polishing process can determine the composition of, or choose the type of, the polishing agent for use in the respective first to fourth steps on the basis of the property of the oxide film coated substrate and the results of determining transition points in the monitoring process.

The polished surface undergoes drastic changes throughout the first to fourth steps of the polishing process. Therefore, improvements to polishing efficiency and post-polish reliability can be made by using different compositions of cerium-based slurries for different steps, particularly the first to third steps, rather than using the same type of slurry for all steps. The exact polishing process of the first step will vary based on whether or not a pattern is present in the oxide film as described above, and will further depend on other factors such as pattern density.

Since the invention enables the detection of transition points between steps, the transition points can be used as the points in the process where process conditions are changed and optimized based on the properties of the substrate. As used herein, the phrase 'properties of the substrate' refers to all of the properties regarding the surface of the substrate, including but not limited to the type of the oxide film, the presence or nonexistence of patterns in the oxide film, and the shape and properties of any existing patterns, such as line widths, pattern densities, and aspect ratios.

In an implementation of the invention, a self-stopping type of polishing agent can be used in the first step of the process. As used herein, the term 'self-stopping type' of polishing agent refers to slurries prepared with a primary purpose of smoothing out irregularities (e.g., pattern steps) provided in the oxide film. With this type of slurry, the surface polishing substantially ceases when the irregularities are removed or when the wafer begins with no surface irregularities. Use of the self-stopping type of polishing agent in the first step tends to reduce the polishing speed as planarization of the oxide film continues, which aids the second step in carrying out an efficient polishing with a high selectivity of the oxide film relative to the nitride film.

In the second step, the process can employ a self-stopping type of polishing agent with water added, or a highly selective type of polishing agent. As used herein, the term 'highly selective type' refers to polishing agents that induce a higher polishing speed on oxide films relative to nitride films, with the ratio of the polishing speed on the oxide film to that on the nitride film being in the range of 80 to 100, or even higher in some implementations.

With any of the above-mentioned polishing agents, it is easier to carry out polishing with a high selectivity between the nitride film and the oxide film in the second step than in the first step. When water is added to the self-stopping type of polishing agent, the concentration of the additive normally present within the polishing agent to form a protective layer on the oxide film is diluted, and therefore a selectivity that is approximately the same as that of a cerium-based slurry is obtained. With a polishing agent exhibiting such a high selectivity, the polishing speed on the oxide film after planarization will increase, thereby enhancing the processing efficiency.

The polishing agent used in the third step can be a self-stopping type of polishing agent with water added, or it can be a highly selective type of polishing agent. The polishing agent can be diluted with water to decrease the polishing speed or to adjust process conditions, such as reducing the polishing pressure or the revolutions per minute of the pad or wafer, relative to the second step that is described below. This tends to reduce dishing of the oxide film in the recesses such as trenches.

In another implementation of the invention, the process can use different polishing pads for different steps. For instance, the process can vary the hardness or type of polishing pads used for each of the first to third steps according to the properties of the substrate coated with the oxide film. Other factors used in choosing the hardness or types of polishing pads can include the measured values of the rate of change in torque in the first to third steps, the transition points found during the monitoring process, or the time required to complete each step (e.g., to cope with a situation where the polishing speed required for a particular oxide film pattern and its density is hard to attain, or a situation where in-surface evenness of the polished surface is required). This can be done either in addition to, or in place of, using different polishing agents for different steps.

In the first and second steps, a polishing pad can be used that is harder than a polishing pad chosen for use in the third step. For instance, if an increase in the polishing speed for the first and second steps is desired, these steps can be carried out using a polishing pad that has a relatively higher hardness than a polishing pad used in the third step. When a transition point is detected between the second and third steps, the polishing process can be halted to allow for a changing of the polishing pad, and the third step can be carried out using a polishing pad of relatively low hardness. This allows the time required for the first and second steps to be shortened while carrying out the polishing of the oxide film at a higher speed. And the use of a relatively soft polishing pad in the third step to carry out over-polishing of the oxide film on trenches (i.e., recesses) allows for an improved in-surface evenness. As a result, the polishing time for the third step can also be shortened.

In an implementation of the invention, the pressure between the substrate and the polishing pad (i.e., the sum of the pressures applied to the substrate and the pad) in the first to third steps can be chosen on the basis of the property of the substrate coated with the oxide film, the transition points determined during the monitoring process, or the measured values of the rate of change in torque in the first to third steps. This allows the process to carry out polishing under intended pressure conditions between the substrate and the polishing pad on the basis of the rate of change in torque in each step, the position of a transition point between one step and the next, and the results of monitoring the time taken for each step. This is helpful when an intended polishing speed required for the type and density of the initial oxide film pattern cannot be attained, or when in-surface evenness is required of the polished surface.

In the first and second steps, for example, it is preferable to bring the polishing pad into pressing contact with the substrate with a pressure higher than that used in the third step. In that case, if a need for a higher polishing speed in the first and second steps arises, the two polishing pads and the substrate are brought into contact with a higher pressure than that used for the third step. It is possible to stop polishing at that higher pressure when a transition point is detected between the first and second steps, and between the second and third steps, and then the third step can be carried out with a lower pressure. This allows the time required for the first and second steps to be shortened while maintaining the planarization process and the state of the oxide film at an increased polishing speed. The polishing time may also be shortened as a synergetic effect in the third step.

In an implementation of the invention, a polishing apparatus for carrying out the above described methods includes a substrate holder, a polishing element located proximate to the substrate holder that includes a polishing pad, a driving element for rotating the substrate holder and/or the polishing element, a polishing agent supplier for supplying a polishing agent containing cerium oxide particles between the substrate and the polishing pad, a water supplier for supplying water between the substrate and the polishing pad, a torque measuring device for measuring the change in torque with time, and a process monitor for monitoring the status of the four steps of the method that are carried out, for determining transition points between adjacent steps of the four steps, and for detecting anomalies in one or more of the four steps. Again, these four steps include a first step during which planarization of the oxide film occurs, a second step during which polishing of the oxide film continues while the planar property of the oxide film is maintained, a third step during which polishing of the oxide film occurs while the protective film under the oxide film becomes partially exposed, and a fourth step during which the oxide film is completely removed and the protective film is substantially entirely exposed.

In an implementation of the invention, the torque measuring device can determine the change in torque with time by directly measuring how the driving current, the driving voltage, or the driving power supplied to the driving element changes over time. In another implementation, the process monitor can control the driving element to stop the polishing process upon detection of an anomaly during at least one of the first to fourth steps. In yet another implementation, the process monitor can control the polishing agent supplier and/or the water supplier based on properties associated with the oxide film coated substrate, and based on the determined transition points between at least two of the first to fourth steps, so that polishing agents tailored for specific steps of the first to third steps can be supplied.

In an implementation, the process monitor can control the substrate holder or the polishing element when the polishing device is provided with a number of polishing pads of different hardness values. The process monitor can choose a polishing pad that has a hardness value appropriate for one of the first to third steps based on properties associated with the oxide film coated substrate, determined transition points between at least two of the first to fourth steps, or measured values of the rate of change in torque in the first to third steps. In an alternative implementation, the process monitor can control the substrate holder or the polishing element itself based on the same properties.

Figure 5:
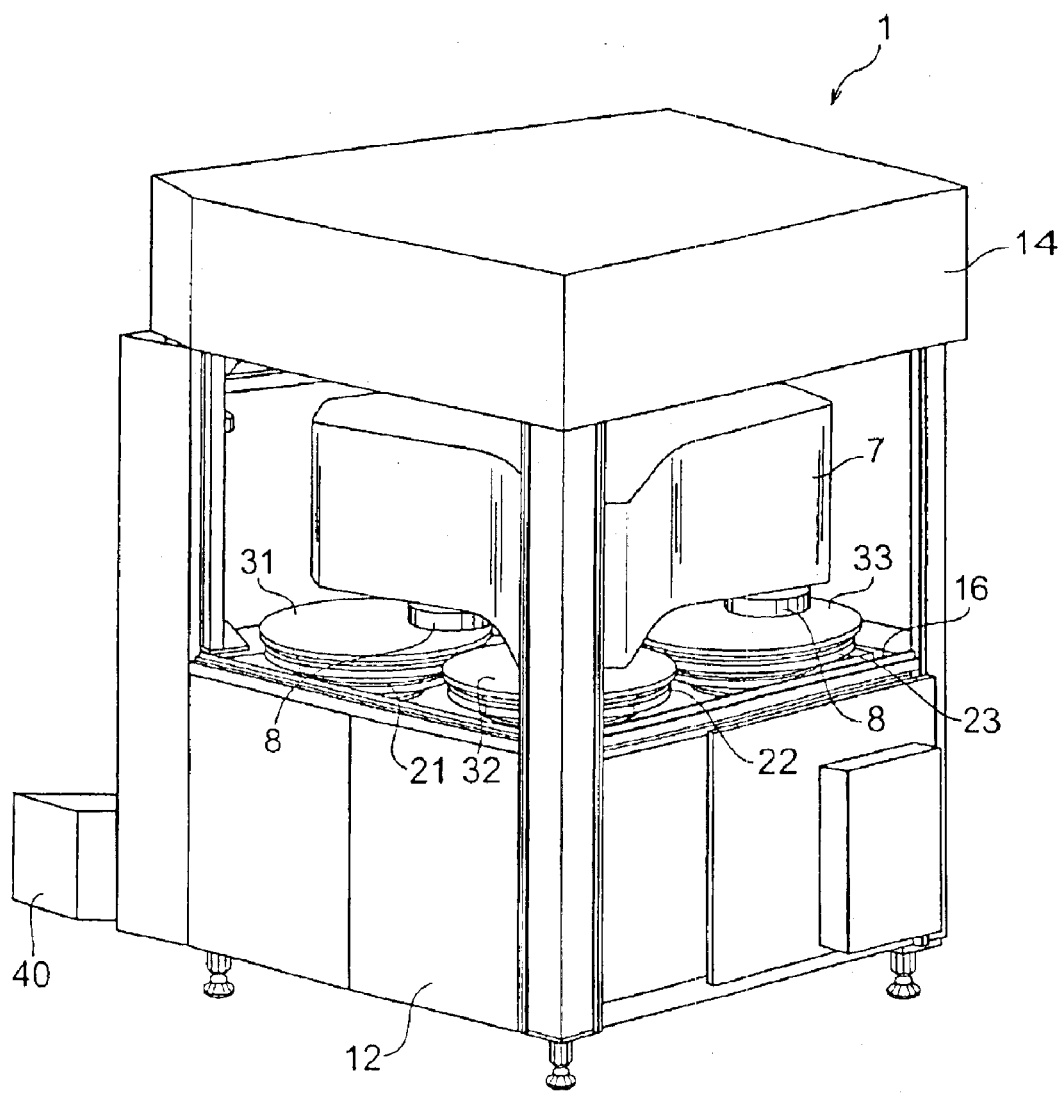
FIG. 5 is an oblique, external view of a polishing device.

FIG. 5 is an oblique, external view of a polishing device 1 (referred to herein as a CMP device 1) constructed in accordance with an implementation of the invention. The CMP device 1 includes a main section 12 and a cover section 14 that is located above the main section 12. The CMP device 1 also includes a monitor-controlling section 40 for monitoring and controlling the flow of the polishing process, and this also functions as the torque measuring device and the process monitor.

The main section 12 includes a polishing table 16 that holds a plurality of polishing pads 31 to 33, each polishing pad mounted atop one of a plurality of rotatable platens 21 to 23. Although three polishing pads are shown in FIG. 5, the main section 12 can hold any number of polishing pads.

Figure 6:
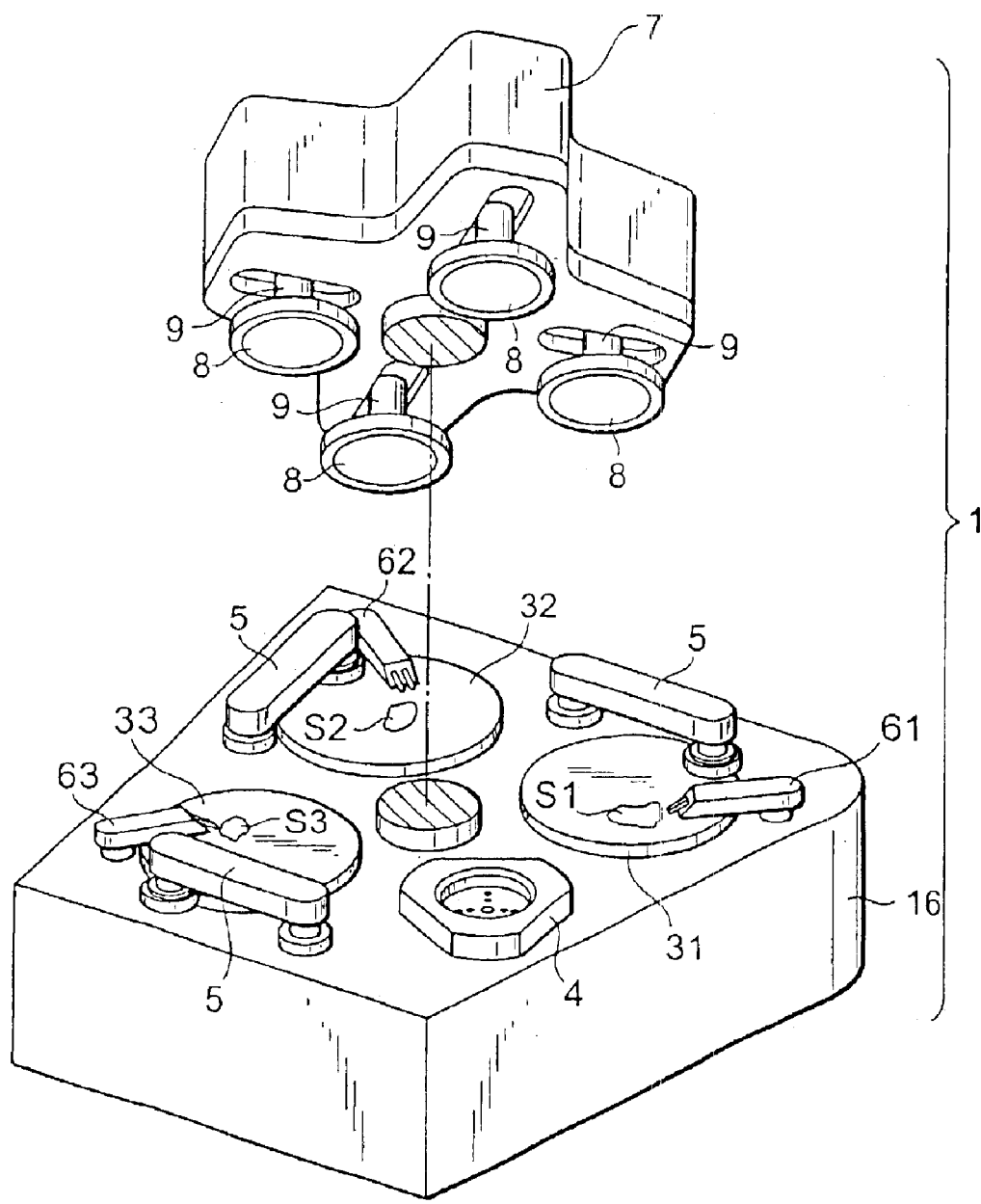
FIG. 6 is an exploded view of one portion of the CMP device.

FIG. 6 is a simplified, exploded view of one portion of the CMP device 1. Here, the polishing table 16 and the polishing pads 31 to 33 can be seen more clearly. As shown here, the CMP device 1 includes a loading cup 4 proximate to polishing pads 31 to 33 to introduce and remove silicon wafers during the polishing process.

CMP device 1 also includes slurry supplying arms 61 to 63 that supply polishing agent slurry S1 to S3 onto the polishing pads 31 to 33. Pad conditioners 5 for adjusting the surface conditions of the polishing pads 31 to 33 are also provided proximate to the polishing pads 31 to 33.

The upper portion of the main section 12 contains a rotatable spindle 7 mounted on the cover section 14. The spindle 7 includes a plurality of polishing heads 8 that are made to contact the polishing pads 31 to 33 through vertically extending rotary shafts 9. In the implementation of FIG. 6, there are four polishing heads 8, three to contact each of the polishing pads 31 to 33 and one to contact the loading cup 4. Each polishing head 8 has an air-inflatable membrane (not shown). The silicon wafers are oriented such that the surface to be polished is facing downward in order to contact the polishing pads 31 to 33.

Figure 7:
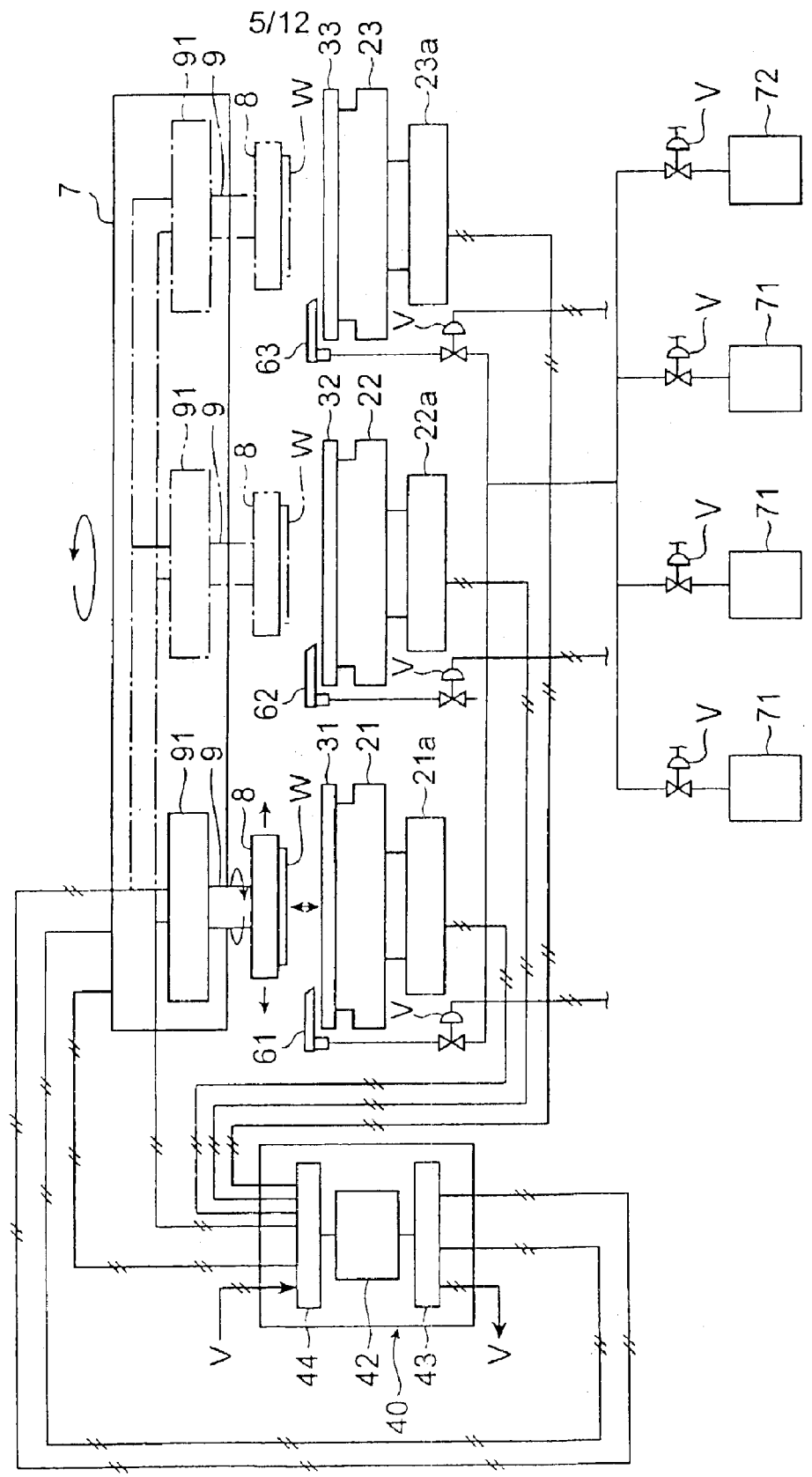
FIG. 7 is a block diagram of the CMP device.

FIG. 7 is a block diagram of the CMP device 1 shown in FIG. 5. The spindle 7 includes built-in polishing head driving sections 91 for rotating the rotary shafts 9 about their axes at any speed and for sweeping the rotary shafts 9 at a predetermined period. The main section 12 similarly has built-in polishing pad driving sections 21a to 23a for rotating the platens 21 to 23 at any speed. The silicon wafers W are shown mounted on the polishing heads 8.

The slurry supplying arms 61 to 63 are coupled to one or more slurry supplying sources 71 and to a pure water supplying source 72. As described above, the polishing agent supplier includes the slurry supplying arms 61 to 63, the slurry supplying sources 71, plural valves V, and the piping used to interconnect all of these components. The water supplier includes the slurry supplying arms 61 to 63, the pure water supplying source 72, plural valves V, and the interconnection piping.

The monitor-controlling section 40 includes a processing unit such as a central processing unit (CPU) 42 connected to an output interface 43 and an input interface 44. The input interface 44 is coupled to a driving section (not shown) of the spindle 7, the polishing head driving sections 91, the polishing pad driving sections 21a to 23a, and the respective valves V. The output interface 43 is connected to the driving section (not shown) of the spindle 7, the polishing head driving sections 91, and the valves V. In alternative implementations, the output interface 43 can also be connected to the polishing pad driving sections 21a to 23a.

Figure 8D:
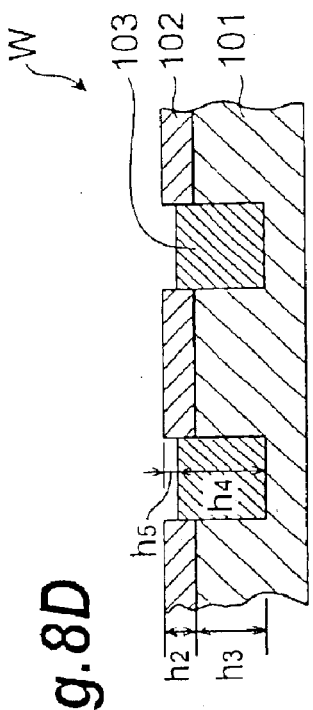
FIGS. 8A to 8F illustrate one implementation for using chemical mechanical polishing in a shallow trench isolation process.
Figure 8E:
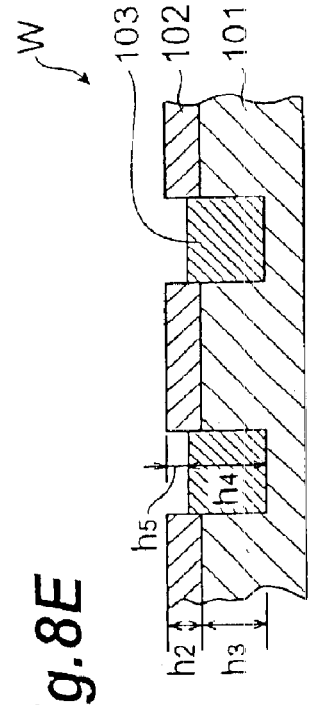
Figure 8F:
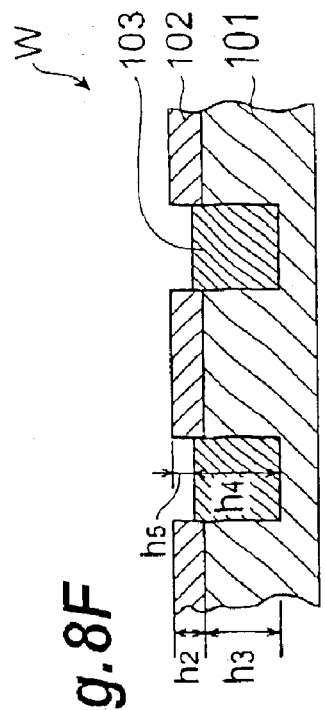
Figure 8A:
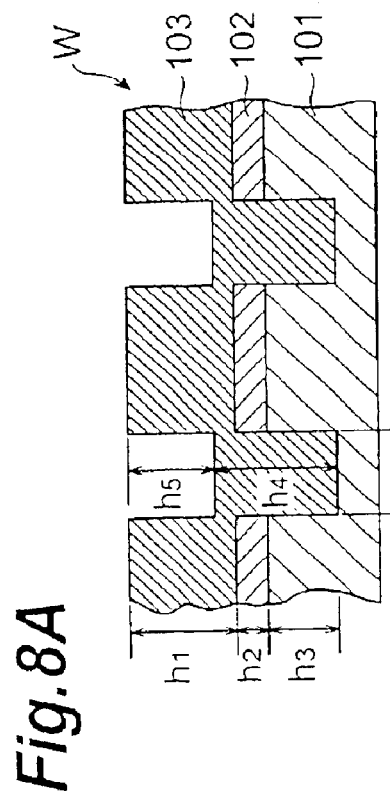

FIGS. 8A to 8F illustrate one implementation for using chemical mechanical polishing in a shallow trench isolation process. FIG. 9 is a flowchart describing a process sequence for a polishing method performed in accordance with the implementation shown in FIGS. 8A to 8F. The process starts at the loading cup 4 where the silicon wafer W is mounted onto the polishing head 8 such that the back side of the wafer W (i.e., the side opposite the surface to be polished) is in contact with the polishing head 8 (step SP0 of FIG. 9). The spindle 7 is then turned to move the polishing head 8 (with the wafer W) to a location above the polishing pad 31 located on the platen 21. As shown in FIG. 8A, the silicon wafer W is formed of a silicon substrate layer 101 in which trenches are formed, a protective film or a silicon nitride film 102 (referred to herein as the nitride film 102) formed over the substrate layer 101, and a silicon oxide film 103 (referred to herein as the oxide film 103) formed over the nitride film 102.

The polishing process continues by carrying out a series of separate polishing steps (collectively shown as step SP1 in FIG. 9). The monitor-controlling section 40 sends a command signal to the polishing head driving section 91 that instructs it to rotate the polishing head 8 about the rotary shaft 9 and to sweep the polishing head 8 in horizontal directions. Likewise, the polishing pad driving section 21a receives a command signal instructing it to rotate the platen 21a and thus the polishing pad 31. The exposed surface of the silicon wafer W is then brought into contact with the polishing pad 31. Polishing agent slurry S1 is delivered to the polishing pad 31 at a time point $t_1$ (see FIG. 1) to start the first step of the polishing process on the silicon oxide film 103 (step SP11). Referring to FIGS. 8A to 8F, in one implementation of the invention, the following conditions can be used to carry out the polishing process:

For the silicon wafer W:

| | |
|---|---|
| Thickness of oxide film 103 on the nitride film 102: | $h_1$ = 6650 Å |
| Thickness of nitride film 102: | $h_2$ = 1650 Å |
| Trench depth: | $h_3$ = 3670 Å |
| Thickness of oxide film 103 on trench: | $h_4$ = 6650 Å |
| Pattern depth in oxide film 103: | $h_5$ = 5320 Å |
| Trench width: | $h_6$ = 250 Å |

For the processing conditions:

| | |
|---|---|
| CMP device: | Based on an Applied Material testing machine |
| Polishing mode: | Batch mode |
| Polishing pad: | Type IC-1400 k-groove |
| Polishing head: | Titan profiler (IC3.8/EC4/PR10/UC4) |
| Sweep period: | 10 sweeps/min (6 sec/sweep) |
| Polishing agent slurry: | Cerium oxide-based slurry, Hitache Kasei make (HS8005:8120 GP = 1:2) |
| | Supply flow rate = 200 ml/min |

The polishing agent slurry S1 contains oxide particles, and its type and composition can be chosen from those described in the following patent documents: International Publication brochure of WO97/29510, Japanese Patent Publication No. 2001-7062, Japanese Patent Publication No. 2001-7195, Japanese Patent Publication No. 2001-185514, and Japanese Patent Publication No. 2001-351882.

Simultaneously with starting the process, the monitor-controlling section 40 starts to measure the motor current (driving current) of the polishing pad driving section 21a. Thus, the torque T of the rotating polishing pad 31 is continuously measured in polishing step SP1 to monitor the process based on the results of the measurements (step SP2 in FIG. 9). In step SP1, the planarization process is first applied to the oxide film 103 to gradually remove the step pattern of the silicon oxide film 103 (step SP11). During this planarization, the torque T gradually increases, with its rate of increase slowing down before the time point $t_2$ where the torque becomes substantially constant (e.g., see FIG. 1). For one implementation, an exemplary list of dimensions for a planar-processed silicon wafer W at this point in the process (e.g., see FIG. 8A) are shown in the following table:

Examples of detailed dimensions of the silicon wafer W at the end of step SP11:

| | |
|---|---|
| Thickness of oxide film 103 on nitride film 102: | $h_1 = 500$ Å |
| Thickness of nitride film 102: | $h_2 = 1650$ Å (unchanged) |
| Trench depth: | $h_3 = 3670$ Å (unchanged) |
| Thickness of oxide film 103 on trench: | $h_4 = 5561$ Å |
| Pattern depth in oxide film 103: | $h_5 = 259$ Å |

Figure 8B:
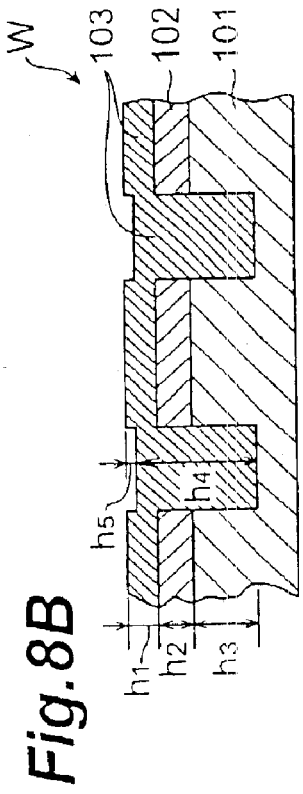
Figure 8C:
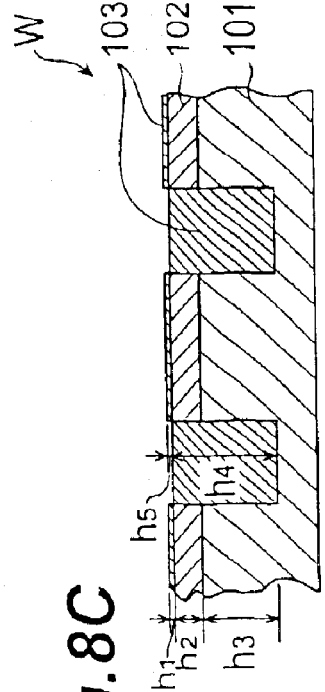
Figure 9:
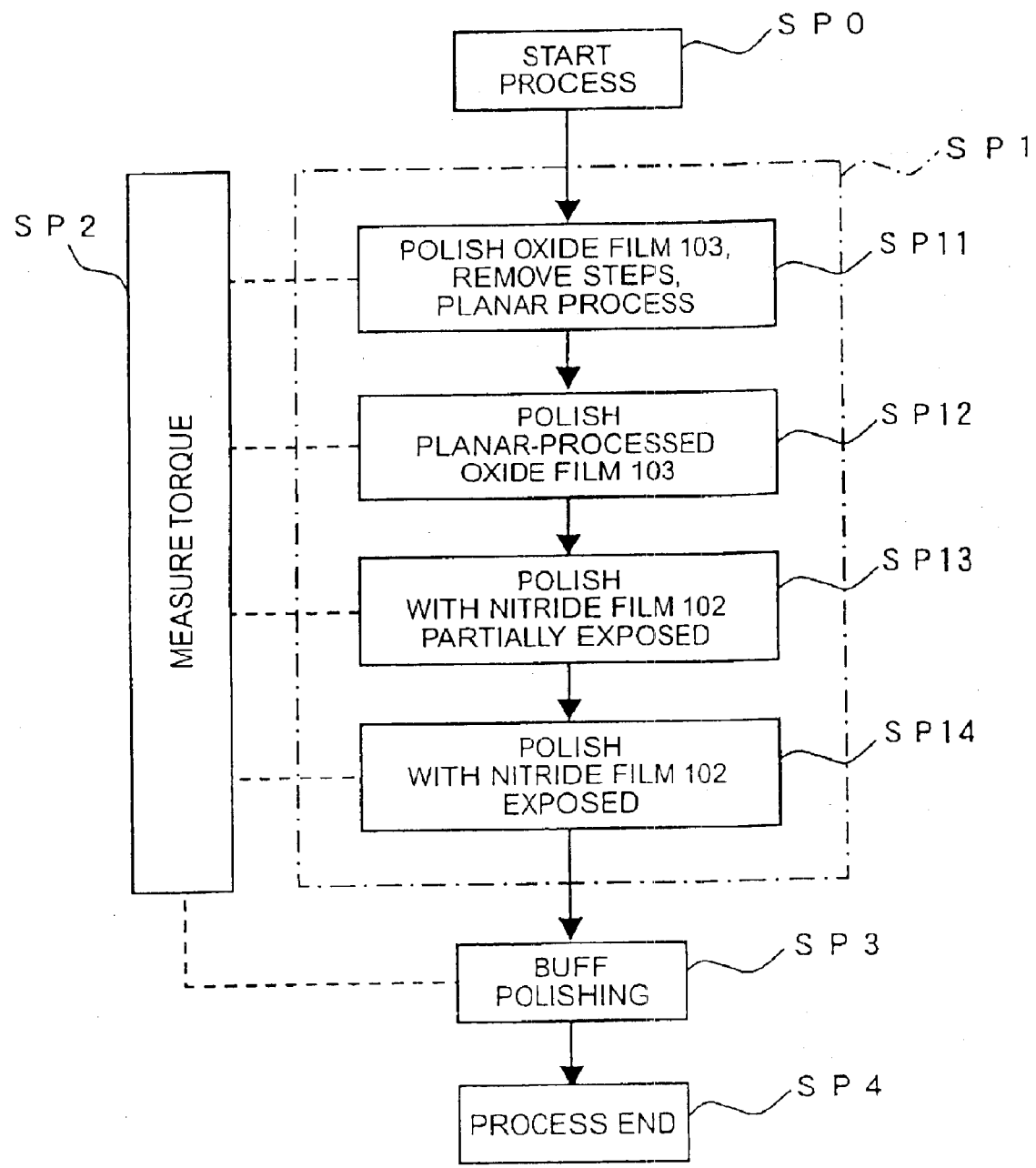
FIG. 9 is a flowchart describing a process sequence for a polishing method performed in accordance with the implementation shown in FIGS. 8A to 8F.

After passing time point $t_2$, polishing continues with the planar property of the oxide film 103 being maintained as shown in FIG. 8B. The torque T remains nearly constant during this time, which is typically the maximum torque level measured during this process (e.g., see FIG. 1), and the oxide film is polished further. In one implementation, an exemplary list of dimensions for a silicon wafer W at this point in the process (e.g., see FIG. 8C), just before reaching the time point $t_3$, are shown in the following table:

Examples of detailed dimensions of a silicon wafer W just before the end of SP12:

| | |
|---|---|
| Thickness of oxide film 103 on nitride film 102: | $h_1 = 240$ Å |
| Thickness of nitride film 102: | $h_2 = 1650$ Å (unchanged) |
| Trench depth: | $h_3 = 3670$ Å (unchanged) |
| Thickness of oxide film 103 on trench: | $h_4 = 5330$ Å |
| Pattern depth in oxide film 103: | $h_5 = 230$ Å |

As time point $t_3$ passes, there is partial exposure of the nitride film 102 and the torque begins to decrease (step SP13). This step is substantially a transitional step from polishing the oxide film 103 to exposing the nitride film 102. The surface of the nitride film 102 that is exposed during this time is also slightly polished. In one implementation, exemplary dimensions of the silicon wafer W at this point in the process (e.g., see FIG. 8D) are shown in the following table:

Examples of detailed dimensions of the silicon wafer W in step SP13:

| | |
|---|---|
| Thickness of nitride film 102: | $h_2 = 1640$ Å |
| Trench depth: | $h_3 = 3670$ Å (unchanged) |
| Thickness of oxide film 103 on trench: | $h_4 = 4983$ Å |
| Pattern depth in oxide film 103: | $h_5 = 327$ Å |

As step SP13 continues, the torque gradually decreases, and prior to reaching time point $t_4$, the rate of decrease becomes moderate. At time point $t_4$, a substantial portion of nitride film 102 is exposed. In one implementation, exemplary dimensions of the silicon wafer W at this point in the process (e.g., see FIG. 8E) are shown in the following table:

Examples of detailed dimensions of the silicon wafer W at the end of step SP13:

| | |
|---|---|
| Thickness of nitride film 102: | $h_2 = 1620$ Å |
| Trench depth: | $h_3 = 3670$ Å (unchanged) |
| Thickness of oxide film 103 on trench: | $h_4 = 4742$ Å |
| Pattern depth in oxide film 103: | $h_5 = 548$ Å |

After passing time point $t_4$ (e.g., see FIG. 1), the nitride film 102 is almost entirely exposed, and the torque becomes nearly constant. Polishing can be continued under this condition to further remove over-polished portions on the trenches (step SP14). In one implementation, exemplary dimensions of the silicon wafer W at this point in the process (e.g., see FIG. 8F) are shown in the following table:

Examples of detailed dimensions of the silicon wafer W in step SP14:

| | |
|---|---|
| Thickness of nitride film 102: | $h_2 = 1565$ Å |
| Trench depth: | $h_3 = 3670$ Å (unchanged) |
| Thickness of oxide film 103 on trench: | $h_4 = 4300$ Å |
| Pattern depth in oxide film 103: | $h_5 = 935$ Å |

After continuing step SP14 for a predetermined period of time, the overall polishing process (step SP1) is halted and the supply of polishing agent slurry S4 is stopped with a command signal from the monitor-controlling section 40. Pure water is then supplied to the polishing pad 31 and buff polishing (step SP3) is used to remove particles. Step SP3 continues for a predetermined period of time and is finally stopped with the monitoring process SP2.

Figure 10:
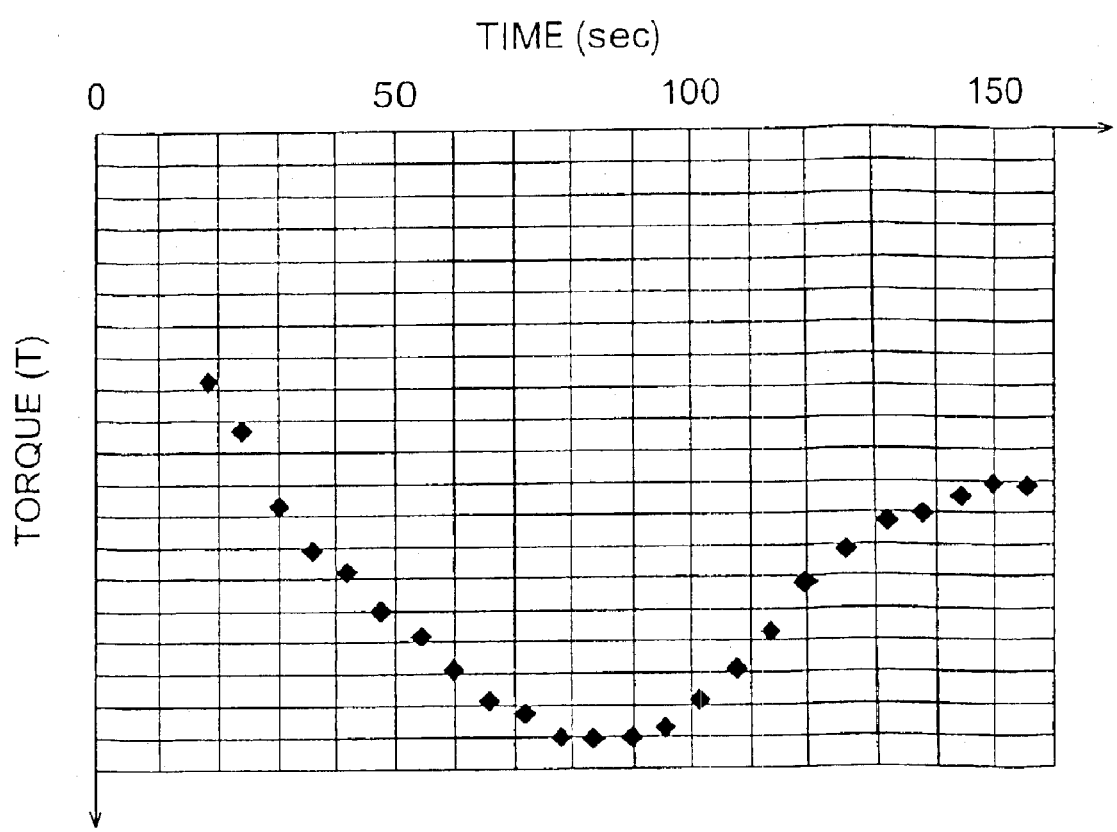
FIG. 10 is an exemplary graph showing the change in the torque with time measured when the polishing method of the present invention is carried out.

FIG. 10 is an exemplary graph showing the change in the torque with time measured when the polishing method of the present invention is carried out under the conditions described above. The diamond-shape symbols in the graph represent values obtained by inputting motor current values into an operation processor 42 (see FIG. 7), averaging the values for every period of sweep, and converting the values into torque values. It was found that the results resemble the pattern shown with curve L1 in FIG. 1.

In the monitoring process SP2, a transition point between two adjacent steps (or a time point of shifting from one step to the next) is determined by the monitor-controlling section 40 using measured values of the change in torque with time for all the steps SP11 to SP14. To accomplish this, the measured torque value at every point in time that is determined by the operation processor 42 is stored. Differentials of the stored values are then sequentially calculated to obtain the change in torque with time.

Increases or decreases in the rate of torque can be determined based on whether the change in torque is positive or negative. As indicated with the curve L1 in FIG. 1, the torque exhibits increase-decrease tendencies characteristic of respective steps SP11 to SP14. Therefore, the end of a step before a transition point and the start of a step after the transition point are detected by finding transition points using such torque change rates. This occurs near time point $t_2$ between step SP11 and step SP12, near time point $t_3$ between step SP12 and step SP13, and near time point $t_4$ between step SP13 and step SP14.

In another implementation, the transition point between steps may be determined for the rate of change in torque with time when step SP12 is substantially omitted, depending on the type of the polishing agent slurry used, and for the change in torque with time when the oxide film 103 is an even film without any pattern (e.g., see FIG. 3).

Figure 11:
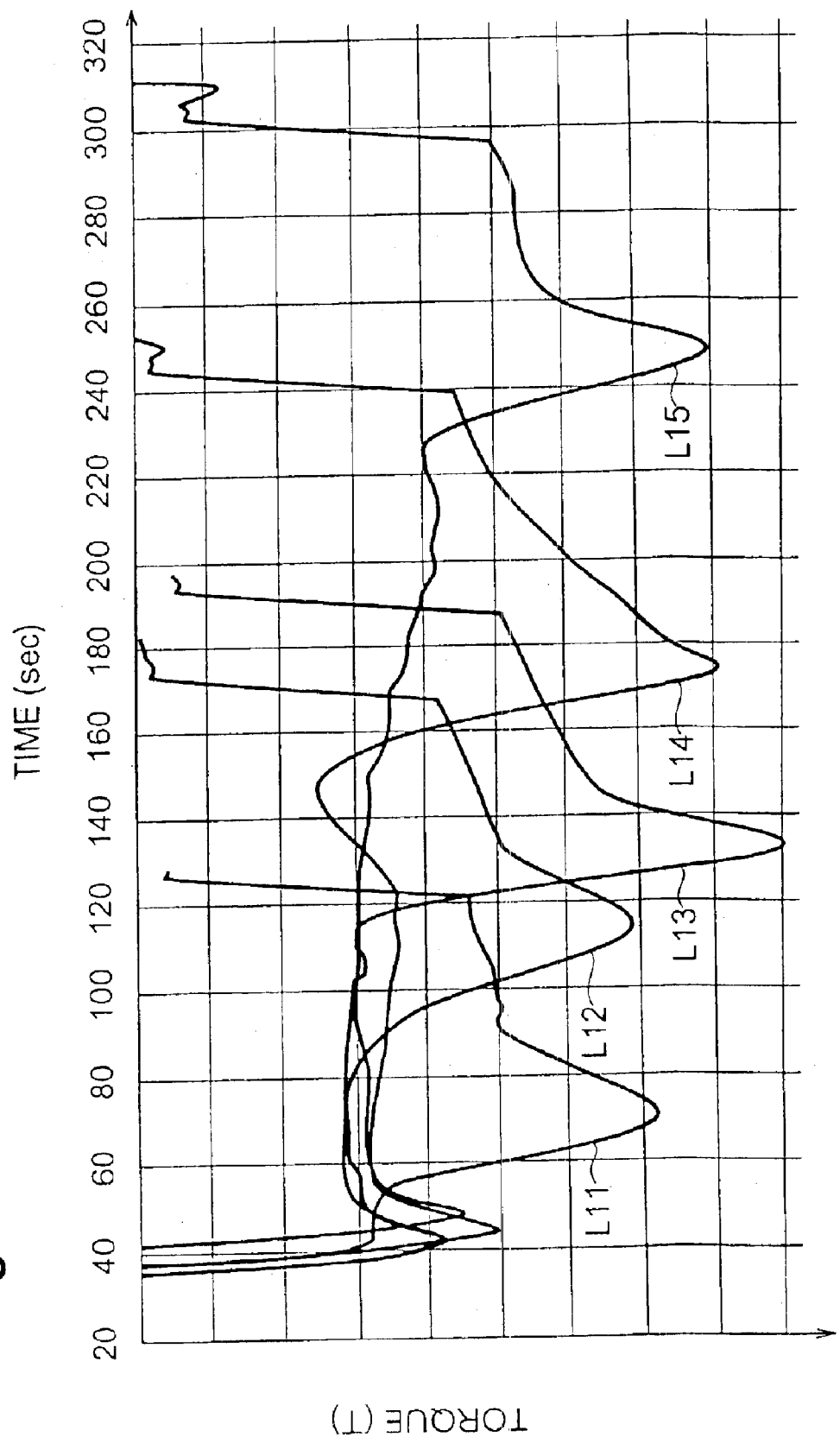
FIG. 11 is a chart illustrating examples of changes in torque observed when the polishing method of the present invention is carried out using different polishing slurries applied to several kinds of silicon wafers.

FIG. 11 is a chart illustrating additional examples of changes in torque (curves L11 to L15) observed when the polishing method of the present invention is carried out using appropriately chosen polishing slurries applied to several kinds of silicon wafers. The silicon wafers used in FIG. 11 have slightly different patterns in the oxide film 103 than the silicon wafer W shown in FIG. 8A. As shown in FIG. 11, the patterns of curves L11 to L15 are substantially similar to the pattern shown for curve L2 of FIG. 2. For curve L14, no clear transition is recognized between the third and fourth steps. In such an example, an anomaly such as insufficient exposure of the nitride film in polishing has presumably occurred.

The polishing method of the invention optimizes process conditions in the monitoring process step SP2 on the basis of measured values of the rate of torque change. This enables the invention to respond to the occurrence of process anomalies as described below, by either stopping the process when an anomaly is detected, or by altering polishing conditions to contend with the anomaly.

Figure 12:
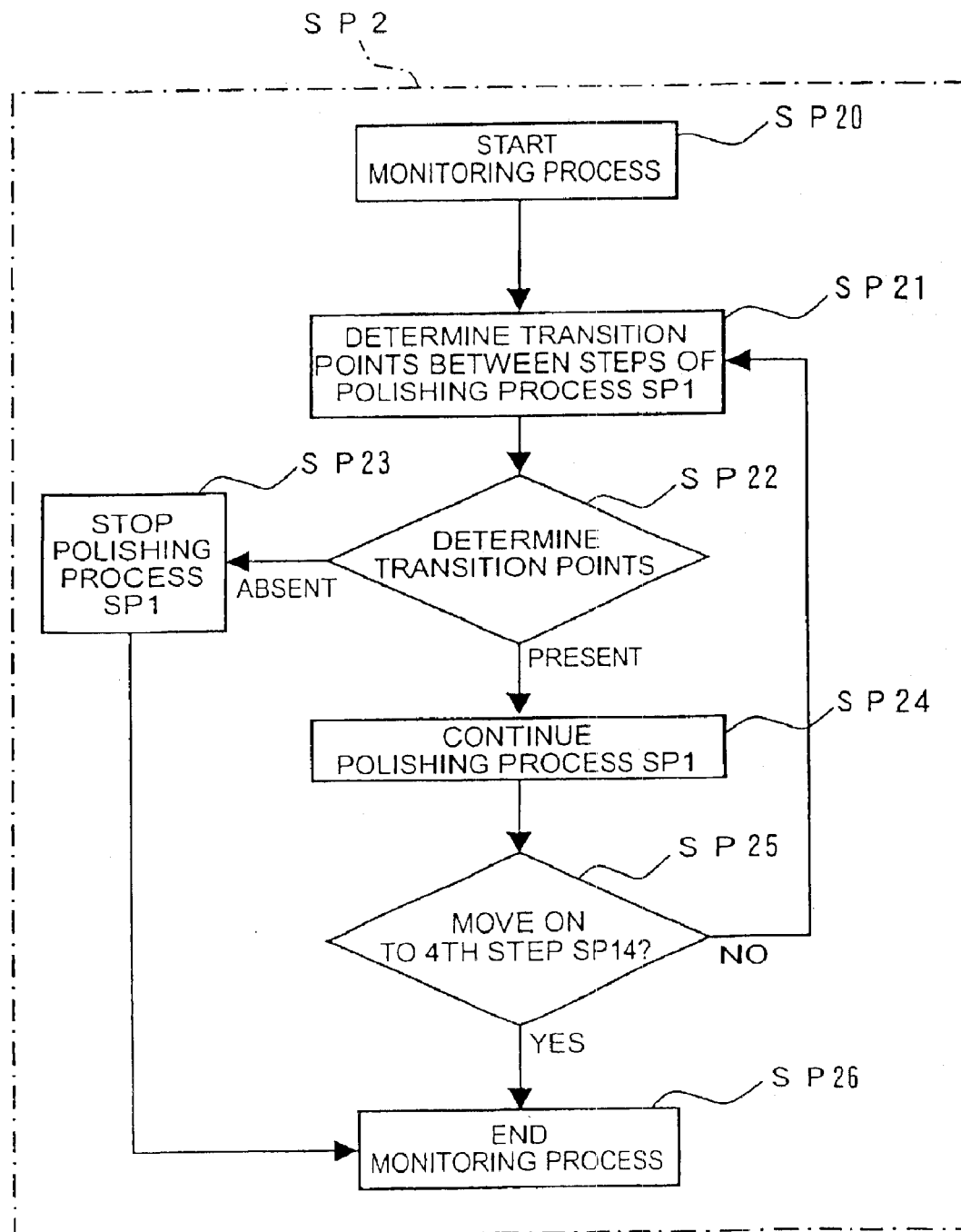
FIG. 12 is a flowchart of a handling sequence in the monitoring process.

FIG. 12 is a flowchart of a handling sequence in the monitoring process SP2. First, the monitoring process SP2 is started simultaneously with the start of the polishing process (step SP20). Transition points between steps are determined as the polishing process continues from steps SP11 to SP14 (step SP21), and the results are used to determine the presence of transition points (step SP22). If an expected transition point is not detected, interlock is applied to stop the polishing process (step SP23) and to end the monitoring process (step SP26). When an expected transition point is not detected, an anomaly or some other problem may have occurred before or after the expected transition point. Therefore, maintenance on the surface of the polishing pad 31, including adjustment, replacement, inspection, etc., can be carried out as required.

For example, returning to FIG. 1, the curve L2 (shown as a dashed line) illustrates an example of the torque change when an anomaly or some other trouble occurs. In FIG. 1, no transition point is detected between step SP11 and step SP12. When this happens, the process can be stopped once step SP13 is detected, as shown in the flowchart of FIG. 12. Curve L2 therefore shows a polishing process that goes on in a state of insufficient planarization through both step SP11 and step SP12.

In the situation where a transition point between steps SP11 and SP12 is detected, polishing step SP1 continues (step SP24) until a transition to step SP14 is detected (step SP25). After step SP14 is complete, a buff-polishing step occurs (step SP3 of FIG. 9), and the monitoring process SP2 ends (step SP26). As shown in FIG. 12, steps SP21 to SP24 are repeated until step SP14 is reached.

Figure 13:
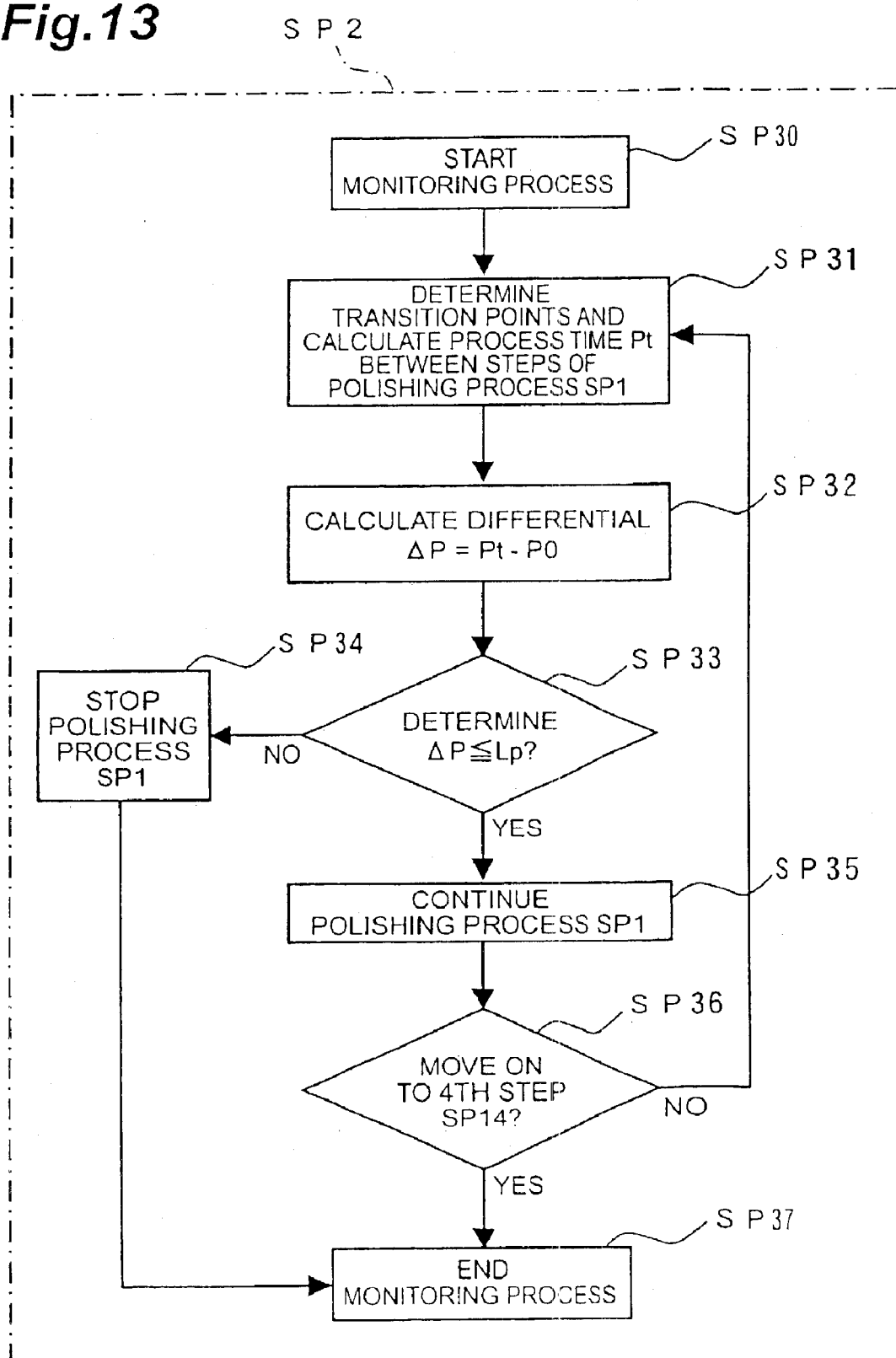
FIG. 13 is a flowchart of another implementation of a handling sequence for the monitoring process.

FIG. 13 is a flowchart of another implementation of a handling sequence for the monitoring process SP2. First, simultaneously with the start of the polishing process, the monitoring process SP2 is started (step SP30). Transition points between steps are detected as the polishing process SP1 cycles through steps SP11 to SP14. In this implementation, the time duration for each step of the process is calculated as well (step SP31). The time durations that correspond to steps SP11 to SP13 are shown in FIG. 1 as time durations, $d_{1 \to 2}$, $d_{2 \to 3}$, and $d_{3 \to 4}$.

At the end of every polishing step, a differential $\Delta P$ is calculated between a reference value P0, which represents a predetermined process time required for a normal polishing process, and a measured value Pt, which represents the actual process time required during a polishing run (step SP32). Next, the calculated differential $\Delta P$ is compared to a predetermined, allowable value Lp (step SP33). Lp represents the maximum tolerable variance allowed between the normal time required for a polishing step and the actual time measured for a polishing step. If $\Delta P$ exceeds the allowable value Lp, the polishing process SP1 is stopped using interlock (step SP34), and the monitoring process SP2 is ended (step SP37). In such a situation, an anomaly or some other trouble, such as excessively low polishing speed in comparison with a normal process, may have occurred somewhere in the process. Therefore, maintenance work, including adjustments, replacement, or inspection of the surface of the polishing pad 31 may be carried out as required.

For example, returning to curve L2 of FIG. 1, the first step of the process begins at time point $t_1$ and continues through time point $t_3$. Accordingly, the total process time for the first step, based on curve L2, is the sum of time duration $d_{1 \to 2}$ and time duration $d_{2 \to 3}$. Assuming that curve L1 represents a normal polishing curve, the time duration for the first step of L1 is only time duration $d_{1 \to 2}$. Thus, it is clear that the time duration of the first step of curve L2 (i.e., the sum of time duration $d_{1 \to 2}$ and time duration $d_{2 \to 3}$) is greater than the time duration of the first step for curve L1 (i.e., time duration $d_{1 \to 2}$). In this situation, $\Delta P$ will likely have exceeded the allowable value Lp. One possible anomaly that may have caused the irregular first step in curve L2 is a decreased polishing speed in steps SP11 through SP13. By the use of the method shown in FIG. 13, the polishing process can be stopped at the time point in any step when the measured value Pt exceeds the reference value P0 plus the allowable value Lp.

On the other hand, if $\Delta P$ does not exceed the allowable value Lp, the polishing process SP1 continues (step SP35), and the transition to step SP14 is detected by the system (step SP36). After step SP14 is complete and a buff polishing (step SP3) is finished, the monitoring process SP2 is ended (step SP37). Otherwise, if step SP14 has not been completed, the process time is calculated at the time of the transition to the next step (step SP31), and the ensuing steps are repeated.

Figure 14:
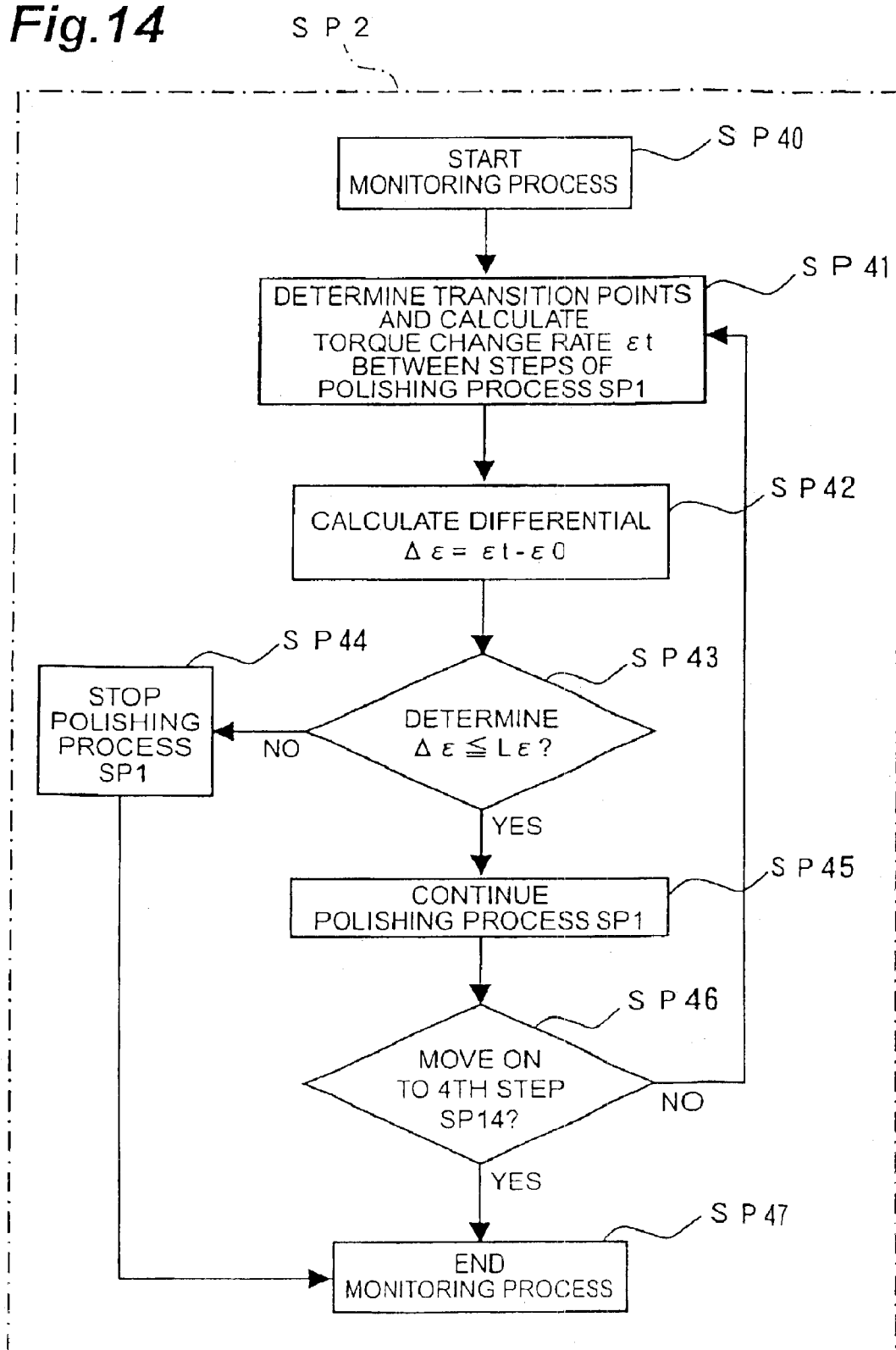
FIG. 14 is a flowchart of another implementation for a handling sequence in the monitoring process.

FIG. 14 is a flowchart of another implementation for a handling sequence in the monitoring process SP2. First, simultaneously with the start of the polishing process, the monitoring process SP2 begins (step SP40). Transition points between steps are detected as the polishing process moves from step SP11 to step SP14 of the polishing process SP1. The rate of change in torque (εt) is calculated using numerical differentiation or the like during the progress of the polishing steps, as shown by the gradients in the graph of FIG. 1 during the time durations $d_{1\to2}$, $d_{2\to3}$, and $d_{3\to4}$. In this implementation, either during or at the end of each polishing step SP11 to SP14, a torque change rate differential Δε is calculated between a measured value of the torque change rate εt and a predetermined reference value of the torque change rate ε0 that represents a normal polishing process (step SP42).

Next, the differential Δε is compared to an allowable value Lε (step SP43). As with Lp above, Lε represents a maximum tolerable variance between a predetermined torque change rate and the actual torque change rate. In the case where Δε exceeds the allowable value Lε, interlock is applied to stop the polishing process SP1 (step SP44) and the monitoring process is ended (step SP47). In such a case, an anomaly or other trouble, such as excessively low polishing speed compared to a normal process, may have occurred during the polishing process. As before, maintenance work on the surface of the polishing pad 31, including adjustment, replacement, inspection, etc., may be carried out as required.

In the case Δε does not exceed the allowable value Lε, the polishing process SP1 continues (step SP45), and the transition to step SP14 is detected by the system (step SP46). After step SP14 is complete, a buff polishing is performed (step SP3), and the monitoring process SP2 is finished (step SP47). Otherwise, if step SP14 has not yet been reached, the process time is calculated at the time of transitioning to the next step (step SP41), and the ensuing steps are repeated.

The monitoring process SP2 described above can also be used for polishing processes that exhibit the torque behavior shown by curves L3 and L5 in the graphs of FIGS. 2 and 3. In those cases, the polishing process can be halted when the torque behavior deviates from the normal pattern of curves L3 and L5, for instance, when the torque follows curves L4 and L6 of FIGS. 2 and 3.

Optimization of the entire polishing process SP1 is also possible when the end of each of steps SP11 to SP13 is found by detecting the transition point between steps using the rate of change in torque, for example, by varying conditions of (1) the type of the polishing agent, (2) the hardness values of the polishing pads 31 to 33, and (3) the pressure between the silicon wafer W and the polishing pads 31 to 33.

For example, step SP11 of the polishing process SP1 can be carried out using the polishing pad 31 in conjunction with a polishing slurry S1 that is of a self-stopping type, or it can be carried out with a hardness of the polishing pad 31 that is greater than that of the polishing pad 33. Alternatively, the process can have polishing pad 31 apply a pressure to the silicon wafer W that is greater than the pressure applied by polishing pad 33. When the transition point signaling the end of step SP11 is detected by the monitor-controlling section 40, the rotation of the polishing pad 31 and of the polishing head 8 is halted by a command signal from the monitor-controlling section 40. The silicon wafer W is then removed from the polishing pad 31, the spindle 7 is rotated, and the silicon wafer W is transported to and brought into contact with the polishing pad 32.

Next, step SP12 can be carried out while supplying a polishing agent slurry that is a highly selective type or a water-added self-stopping type onto the polishing pad 32, and rotating both the polishing pad 32 and the silicon wafer W. Different types and compositions of slurries can be stored respectively in plural slurry supply sources 71, as shown in FIG. 7. In this implementation, the hardness of the polishing pad 32 is the same as that of the polishing pad 31, and the contact pressure is also the same as in step SP11. When the monitor-controlling section 40 detects the transition point between steps SP11 and SP12, rotation of the polishing pad 32 and of the polishing head 8 is halted by a command signal from the monitor-controlling section 40. Next, the silicon wafer W is removed from the polishing pad 32, the spindle 7 is rotated, and the silicon wafer W is transported to and brought into contact with the polishing pad 33.

Next, a polishing slurry 33 prepared by adding an appropriate additive to a highly selective type of slurry, or by adding pure water and an appropriate additive to a self-stopping type of slurry, is supplied onto the polishing pad 33. The polishing pad 33 and the silicon wafer W are then rotated to carry out step SP13. In this step, the polishing pad 33 can be softer than the polishing pads 31 and 32, and the pressure applied by the polishing pad 33 onto the wafer W can be lower than the pressure applied in steps SP11 and SP12. In an implementation, the relative rotation speed between the silicon wafer W and the polishing pad 33 can be increased.

According to the above-described CMP device 1, as well as the above-described polishing methods associated with this device 1, when carrying out the CMP process on an oxide film 103, the change in torque with time in each of the steps SP11 to SP14 is monitored by measurements. Therefore, the progress of each step and the occurrence of anomalies or other troubles can be determined in real time. The detection of the end point of each step, which conventional end point detection techniques using torque measurements and silica-based slurries cannot sufficiently cope with, can be accurately carried out. Process management can be improved by detecting anomalies in the polishing process, which leads to improvements in the yield and reliability of semiconductor devices.

With the detection of transition points between steps SP11 to SP14 made possible by the present invention, condition settings matching the respective steps can be implemented. Since transition points from one step to the next can be accurately determined using the rate of change in torque, end point detection can be made accurately. Therefore, it is possible to implement more reliable effects by switching the process conditions.

As described above, the polishing methods and devices of the present invention enable optimal process management and process control during CMP processes, in particular for processes forming separate elements by STI.

What is claimed is:

1. A polishing method for chemical mechanical polishing of an oxide film adjacent to a protective film formed proximate to a substrate having recesses, the method comprising:

a first step of planarizing the oxide film by bringing the oxide film into contact with a polishing pad, supplying a polishing agent containing cerium oxide particles between the oxide film and the polishing pad, and causing relative rotational motion between the substrate and the polishing pad;

a second step of continuing to polish the oxide film once the oxide film has been planarized, thereby maintaining the planarized property of the oxide film;

a third step of continuing to polish the oxide film until at least a portion of the protective film becomes exposed;

a fourth step of continuing to polish the oxide film until the oxide film is substantially removed and the protective film is substantially exposed;

measuring torque on the substrate or on the polishing pad either continuously or at intervals during the first through fourth steps; and determining changes in torque with time to determine the status of each of the first through fourth steps concurrently with the polishing method;

wherein one or more transition points between at least two adjacent steps of the first through steps are detected based at least in part on the determined changes in torque with time; and wherein a transition point is detected between the first and second steps by determining a time point at which the determined change in torque with time goes from a positive value to a value of approximately zero.

2. The polishing method of claim 1, wherein the measuring of the torque comprises measuring one or more of a driving current, a driving voltage, and a driving power of a mechanism that rotates the substrate or the polishing pad and calculating the torque.

3. A polishing method for chemical mechanical polishing of an oxide film adjacent to protective film formed proximate to a substrate having recesses, the method comprising:

a first step of planarizing the oxide film by bringing the oxide film into contact with a polishing pad, supplying a polishing agent containing cerium oxide particles between the oxide film and the polishing pad, and causing relative rotational motion between the substrate and the polishing pad;

a second step of continuing to polish the oxide film once the oxide film has been planarized, thereby maintaining the planarized property of the oxide film;

a third step of continuing to polish the oxide film until at least a portion of the protective film becomes exposed;

a fourth step of continuing to polish the oxide film until the oxide film is substantially removed and the protective film is substantially exposed;

measuring torque on the substrate or on the polishing pad either continuously or at intervals during the first through fourth steps; and determining changes in torque with time to determine the status of each of the first through fourth steps concurrently with the polishing method;

wherein one or more transition points between at least two adjacent steps of the first through fourth steps are detected based at least in part on the determined changes in torque with time; and wherein a transition point is detected between the second and third steps by determining a time point at which the determined change in torque with time goes from a value of approximately zero to a negative value.

4. The polishing method of claim 1, wherein a transition point is detected between the third and fourth steps by determining a time point at which the determined change in torque with time goes from a negative value to a value of approximately zero.

5. A polishing method for chemical mechanical polishing of an oxide film adjacent to a protective film formed proximate to a substrate having recesses, the method comprising:

a first step of planarizing the oxide film by bringing the oxide film into contact with a polishing pad, supplying a polishing agent containing cerium oxide particles between the oxide film and the polishing pad, and causing relative rotational motion between the substrate and the polishing pad;

a second step of continuing to polish the oxide film once the oxide film has been planarized, thereby maintaining the planarized property of the oxide film;

a third step of continuing to polish the oxide film until at least a portion of the protective film becomes exposed;

a fourth step of continuing to polish the oxide film until the oxide film is substantially removed and the protective film is substantially exposed;

measuring torque on the substrate or on the polishing pad either continuously or at intervals during the first through fourth steps; and determining changes in torque with time to determine the status of each of the first through fourth steps concurrently with the polishing method, wherein anomaly in a least one of the first through fourth steps is detected by comparing the determined changes in torque with time to a reference pattern that is predetermined based on one or more of the oxide film, the protective film, and the polishing agent.

6. The polishing method of claim 5, wherein an anomaly is detected in at least one of the first through fourth stops when no transition point is detected between at least two adjacent steps of the first through fourth steps.

7. The polishing method of claim 5, wherein an anomaly in at least one of the first through fourth steps is detected when at least one of the determined changes in torque with time deviates from its corresponding value in the reference pattern by an amount that exceeds a predetermined allowable value.

8. The polishing method of claim 5, wherein an anomaly in at least one of the first through fourth steps is detected when the actual time required for one of the steps deviates from the time required for the corresponding step in the reference pattern by an amount that exceeds a predetermined allowable value.

9. The polishing method of claim 5, wherein an anomaly in at least one of the first and second steps is detected when the determined changes in torque with time provide no indication of the presence of the second step.

10. The polishing method of claim 1, wherein each of the first through third steps can use different polishing agents, and wherein the composition of the polishing agent used for each step is based at least in part on properties associated with the oxide film or on the detected transition points.

11. The polishing method of claim 10, wherein the polishing agent used in the first step comprises a self-stopping type of polishing agent.

12. The polishing method of claim 11, wherein the polishing agent used in the second step comprises either a self-stopping type of polishing agent with water added or a highly selective type of polishing agent.

13. The polishing method of claim 11 or 12, wherein the polishing agent used in the third step comprises either a self-stopping type of polishing agent with water added or a highly selective type of polishing agent.

14. The polishing method of claim 1, wherein the type of polishing pad used for each of the first through third steps is chosen based at least in part on properties associated with the oxide film or on the detected transition points or both.

15. The polishing method of claim 14, wherein the polishing pads used for the first and second steps have a hardness level that is greater than that of the polishing pad used for the third step.

16. The polishing method of claim 1, wherein a different pressure can be applied between the polishing pad and the substrate during each of the first through third steps, each applied pressure being chosen based at least in part on properties associated with the oxide film during each step and on the detected transition points.

17. The polishing method of claim 16, wherein the applied pressure between the polishing pad and the substrate during the first and second steps is greater than the applied pressure during the third step.

* * * * *